US008358144B2

(12) United States Patent
Maruyama et al.

(10) Patent No.: US 8,358,144 B2
(45) Date of Patent: Jan. 22, 2013

(54) METHOD FOR MANUFACTURING SEMICONDUCTOR DEVICE, SEMICONDUCTOR INSPECTION DEVICE, AND PROGRAM INCLUDING COLOR IMAGING OF METAL SILICIDE

(75) Inventors: Hotaka Maruyama, Tochigi (JP); Masumi Mitsubori, Kanagawa (JP); Kaoru Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 266 days.

(21) Appl. No.: 12/912,879

(22) Filed: Oct. 27, 2010

(65) Prior Publication Data

US 2011/0038528 A1 Feb. 17, 2011

Related U.S. Application Data

(62) Division of application No. 11/615,724, filed on Dec. 22, 2006, now Pat. No. 7,842,520.

(30) Foreign Application Priority Data

Dec. 28, 2005 (JP) ................. 2005-378220

(51) Int. Cl.
*H01L 21/66* (2006.01)
*H01L 21/4763* (2006.01)

(52) U.S. Cl. ............ 324/717; 438/16; 438/649
(58) Field of Classification Search ........... 324/717; 438/16, 649
See application file for complete search history.

(56) References Cited

U.S. PATENT DOCUMENTS

| 5,091,963 | A | 2/1992 | Litt et al. |
| 6,406,743 | B1 | 6/2002 | Lee et al. |
| 6,515,293 | B1 | 2/2003 | Jun et al. |
| 2004/0254769 | A1 | 12/2004 | Miyairi et al. |

FOREIGN PATENT DOCUMENTS

| JP | 05-283696 A | 10/1993 |
| JP | 08-327497 A | 12/1996 |
| JP | 11-145231 A | 5/1999 |
| JP | 2001-116519 A | 4/2001 |
| JP | 2004-311992 A | 11/2004 |

*Primary Examiner* — William M. Brewster
(74) *Attorney, Agent, or Firm* — Fish & Richardson P.C.

(57) ABSTRACT

A manufacturing method of a semiconductor device capable of efficiently inspecting whether a metal silicide layer is sufficiently formed is provided. The manufacturing method is provided with the steps of forming a metal layer over a semiconductor layer containing silicon; forming a metal silicide layer over a surface of the semiconductor layer by heating the semiconductor layer and the metal layer; generating image data by performing color imaging of the metal silicide layer from above the metal silicide layer; calculating saturation of the metal silicide layer by processing the image data; and judging the formation amount of the metal silicide layer on the basis of the calculated saturation.

24 Claims, 17 Drawing Sheets

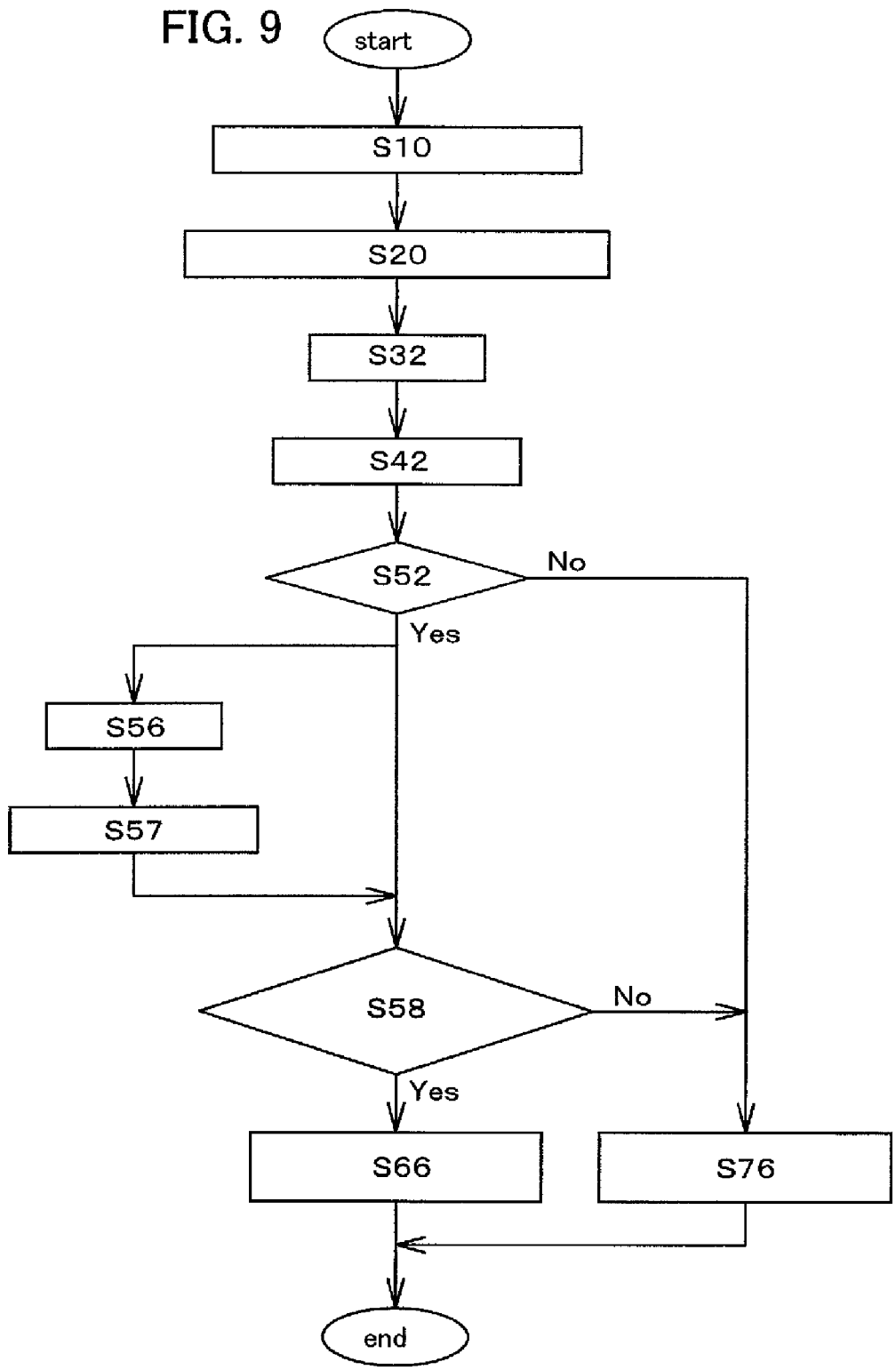

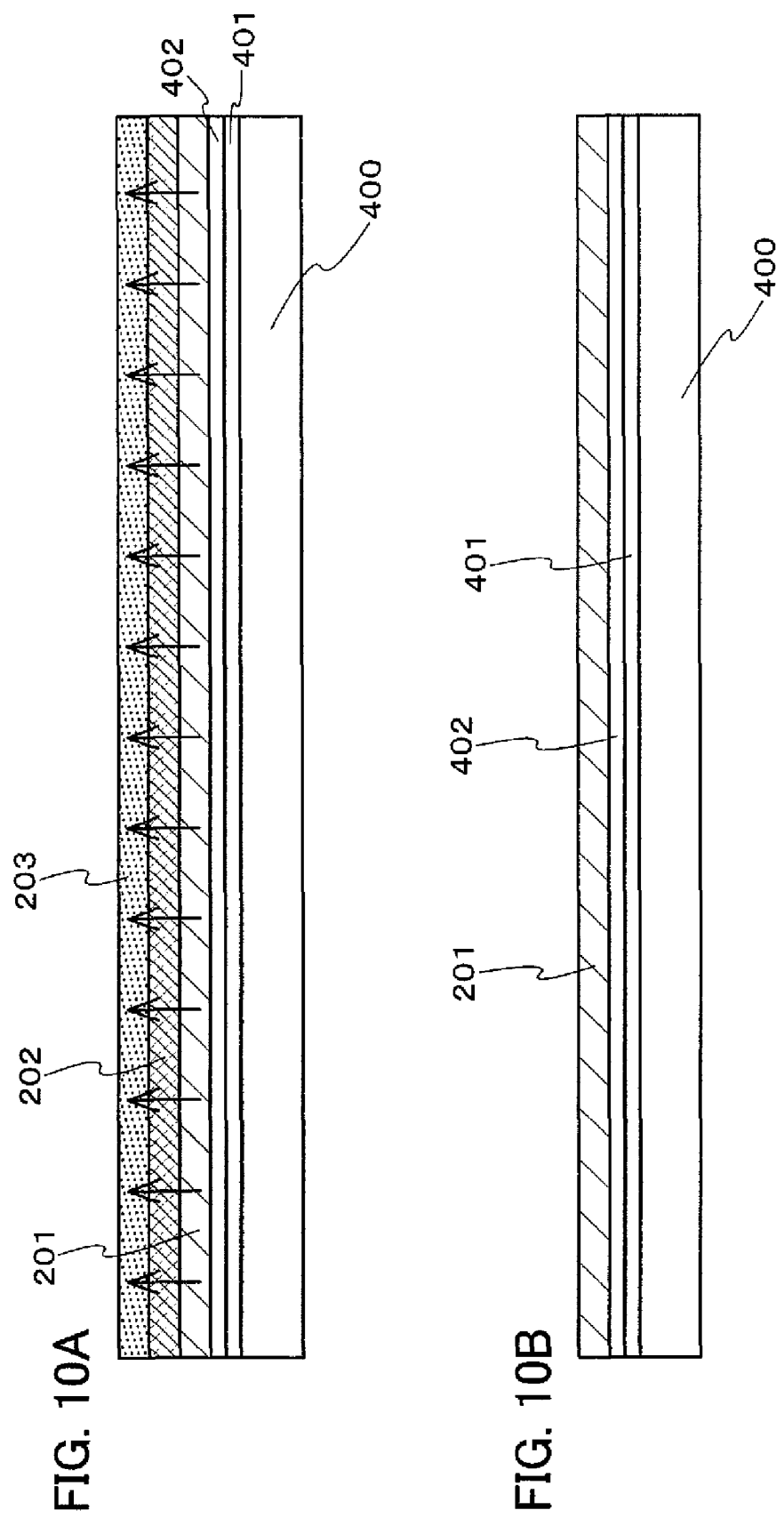

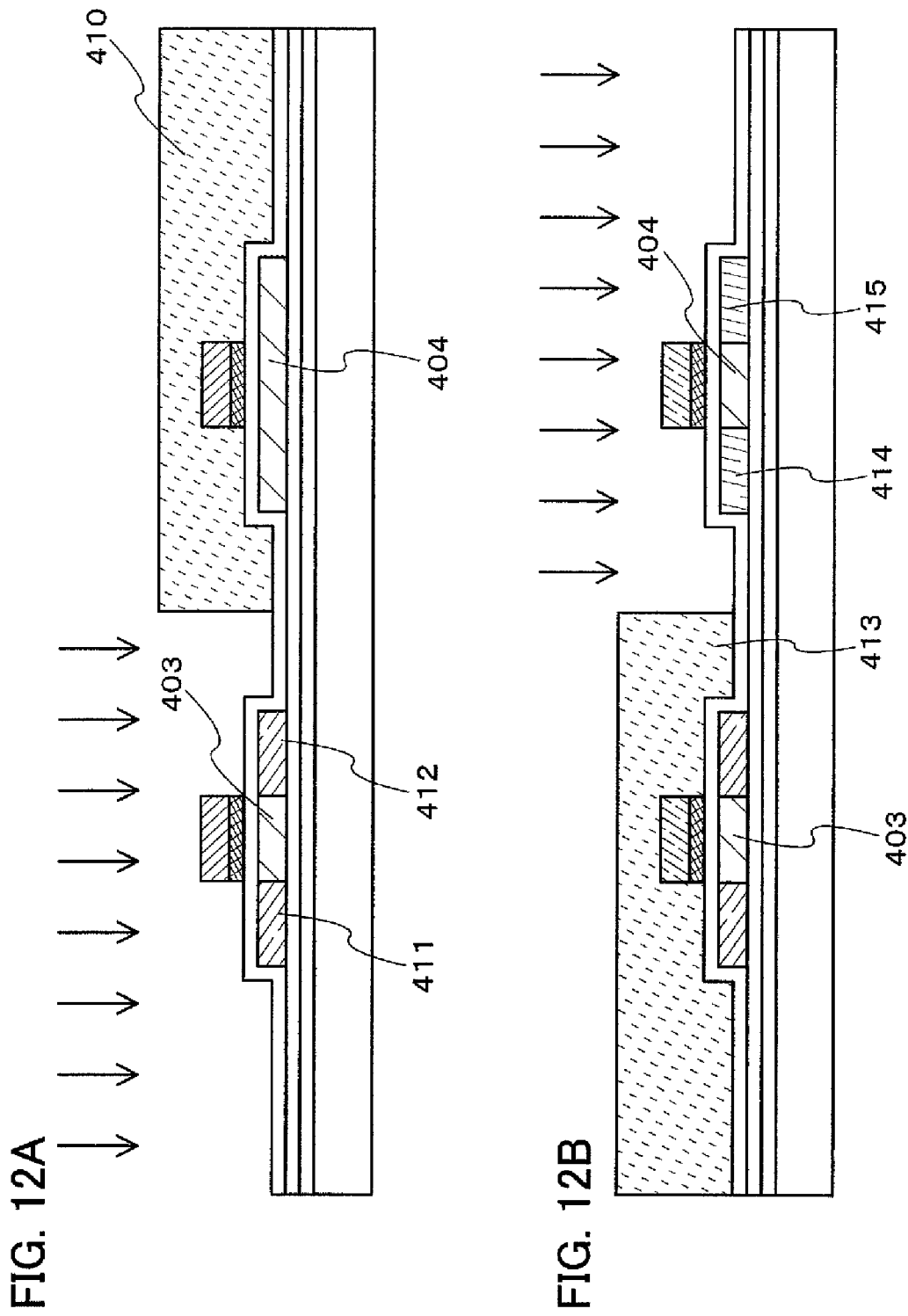

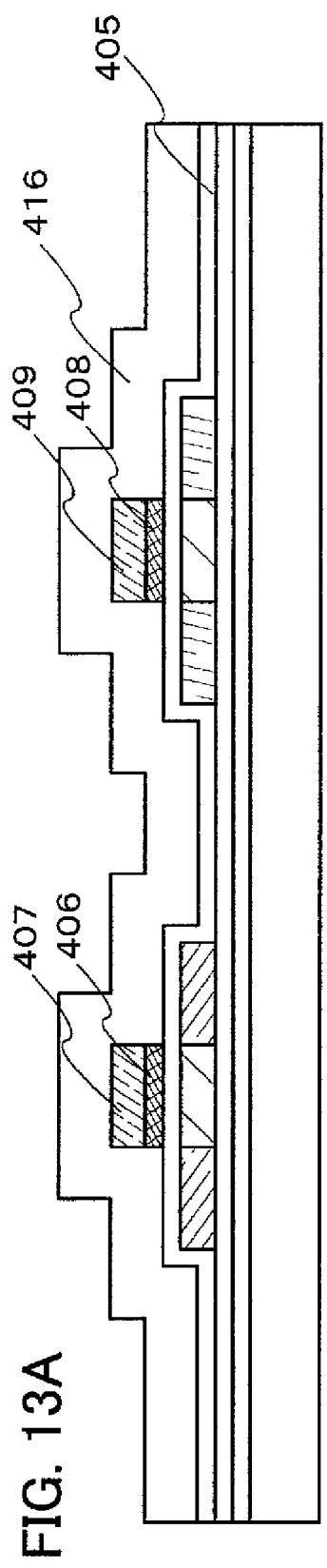
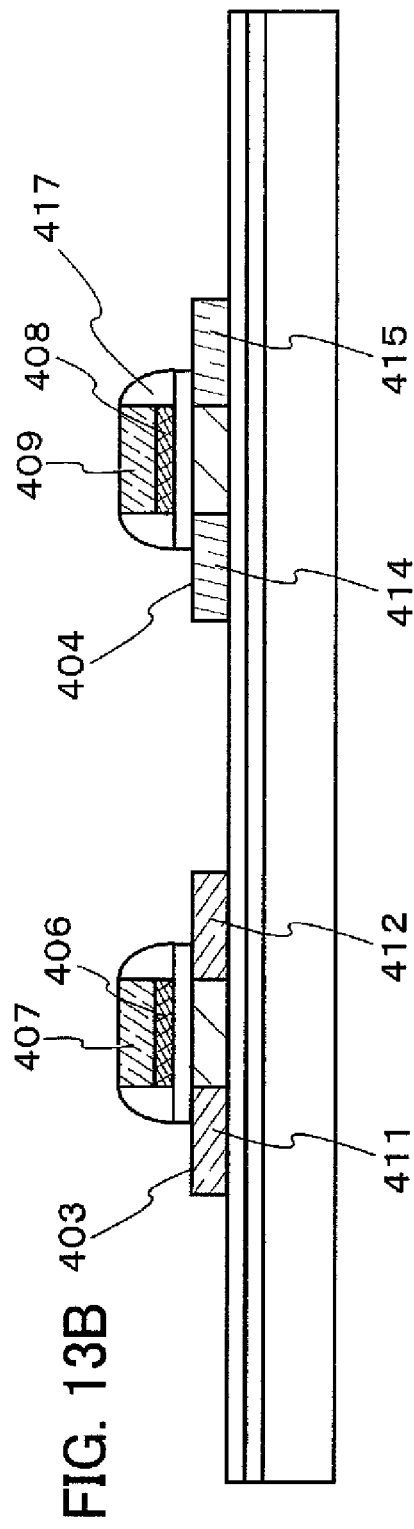
FIG. 13A
FIG. 13B

METHOD FOR MANUFACTURING SEMICONDUCTOR DEVICE, SEMICONDUCTOR INSPECTION DEVICE, AND PROGRAM INCLUDING COLOR IMAGING OF METAL SILICIDE

CROSS-REFERENCE TO RELATED APPLICATIONS

This application is a divisional of U.S. application Ser. No. 11/615,724, filed Dec. 22, 2006, now allowed, which claims the benefit of a foreign priority application filed in Japan as Serial No. 2005-378220 on Dec. 28, 2005, both of which are incorporated by reference.

BACKGROUND OF THE INVENTION

1. Field of the Invention

The present invention relates to a method for manufacturing a semiconductor device having a step of forming a metal silicide layer, a semiconductor inspection device, and a program.

2. Description of the Related Art

Lowering contact resistance for an impurity region formed in a semiconductor layer containing silicon (for example, a source region or drain region of a transistor) and lowering resistance in such impurity regions have been required with high-integration and miniaturization of a semiconductor device. For lowering resistances, it is effective to form a metal silicide layer such as a titanium silicide layer, a cobalt silicide layer, or a nickel silicide layer over a surface of the semiconductor layer.

A method for forming the metal silicide layer is as follows. First, a metal layer such as a titanium layer, a cobalt layer, or a nickel layer is formed over a semiconductor layer containing silicon by a sputtering method, for example. Subsequently, the metal layer and the semiconductor layer are heat-treated (for example, at 400° C.) by an RTA method. Accordingly, silicon is dispersed in the metal layer or metal is dispersed in the semiconductor layer containing silicon, and metal and silicon react with each other, whereby a metal silicide layer is formed. Thereafter, metal which is not silicified is removed by wet etching (for example, see Patent Document 1: Japanese Published Patent Application No. H5-283696 (17th paragraph and 18th paragraph).

SUMMARY OF THE INVENTION

In the above process, there is a case where the metal silicide layer is not sufficiently formed over the whole area of a surface, such as a case where variations in the thickness of the metal silicide layer are generated for some reason or a case where part of the metal silicide layer is not formed. In this case, contact resistance and sheet resistance of the semiconductor layer containing silicon are not sufficiently lowered.

Therefore, it is necessary to inspect whether the metal silicide layer is sufficiently formed. For an inspection method, there is a method by which the contact resistance or the sheet resistance of the semiconductor layer is actually measured using a probe terminal. However, in this method, forming a pad which connects to the probe terminal is necessary. That is to say, it is necessary to form an interlayer insulating film over the semiconductor layer over which the metal silicide layer is formed and further form a connection hole and a wiring layer. Because of this, measurement efficiency has been bad.

The present invention has been made in view of the above situations. It is an object of the present invention to provide a method for manufacturing a semiconductor device capable of efficiently inspecting whether a metal silicide layer is sufficiently formed, a semiconductor inspection device, and a program.

In order to solve the above problems, a method for manufacturing a semiconductor device according to the present invention is provided with the steps of forming a metal layer over a semiconductor layer containing silicon; forming a metal silicide layer over a surface of the semiconductor layer by heating the semiconductor layer and the metal layer; generating image data by performing color imaging of the metal silicide layer from above the metal silicide layer; calculating saturation of the metal silicide layer by processing the image data; and judging the formation amount of the metal silicide layer on the basis of the calculated saturation.

According to this method for manufacturing the semiconductor device, the formation amount of the metal silicide layer is judged on the basis of the saturation of the metal silicide layer. Therefore, the method makes it possible to efficiently inspect whether the metal silicide layer is sufficiently formed.

Another method for forming a semiconductor device according to the present invention is provided with the steps of forming a metal layer over a semiconductor layer containing silicon; forming a metal silicide layer over a surface of the semiconductor layer by heating the semiconductor layer and the metal layer; generating image data by performing color imaging of the metal silicide layer from above the metal silicide layer; calculating hue of the metal silicide layer by processing the image data; and judging the formation amount of the metal silicide layer on the basis of the calculated hue.

According to this method for manufacturing a semiconductor device, the formation amount of the metal silicide layer is judged on the basis of the hue of the metal silicide layer is judged. Therefore, the method makes it possible to efficiently inspect whether the metal silicide layer is sufficiently formed.

The metal layer is, for example, a nickel layer, a titanium layer, or a cobalt layer. The metal silicide layer is, for example, a nickel silicide layer, a titanium silicide layer, or a cobalt silicide layer. The semiconductor layer is, for example, a source or drain of a thin film transistor.

A semiconductor inspection device according to the present invention is provided with imaging means for generating image data by performing color imaging of a metal silicide layer formed over a surface of a semiconductor layer containing silicon; a saturation calculating portion for calculating saturation of the metal silicide layer by processing the image data; and a judging portion for judging the formation amount of the metal silicide layer on the basis of the saturation calculated by the saturation calculating portion.

When the judging portion has an equation expressing the correlation between sheet resistance and saturation of the metal silicide layer, the judging portion judges that the metal silicide layer is sufficiently formed when the saturation calculating portion calculates sheet resistance by substituting calculated saturation into the equation and the calculated sheet resistance is less than or equal to the reference value. In addition, when the judging portion has an equation expressing the correlation between thickness and saturation of the metal silicide layer, the judging portion may judge that the metal silicide layer is sufficiently formed when the saturation calculating portion calculates thickness by substituting calculated saturation into the equation and the calculated thickness is greater than or equal to the reference value.

When the image data is RGB image data, the hue calculating portion may calculate saturation of the metal silicide layer by processing the RGB image data when G intensity is greater than B intensity in the RGB image data.

Another semiconductor inspection device according to the present invention is provided with imaging means for generating image data by performing color imaging of a metal silicide layer formed over a surface of a semiconductor layer containing silicon; a hue calculating portion for calculating hue of the metal silicide layer by processing the image data; and a judging portion for judging the formation amount of the metal silicide layer on the basis of the hue calculated by the hue calculating portion.

In a case where the judging portion has an equation expressing the correlation between sheet resistance and hue of the metal silicide layer, the judging portion may judge that the metal silicide layer is sufficiently formed when the hue calculating portion calculates sheet resistance by substituting calculated hue into the equation and the calculated sheet resistance is less than or equal to the reference value. In addition, when the judging portion has an equation expressing the correlation between thickness and hue of the metal silicide layer, the judging portion may judge that the metal silicide layer is sufficiently formed when the hue calculating portion calculates thickness by substituting calculated hue into the equation and the calculated thickness is greater than or equal to the reference value.

When the image data is RGB image data, the hue calculating portion may calculate hue of the metal silicide layer by processing the RGB image data when G intensity is greater than B intensity in the RGB image data.

A program according to the present invention is a program which is run by a computer and is a program for judging the formation amount of a metal silicide layer by processing image data of the metal silicide layer, where a function for calculating saturation of the metal silicide layer by processing the image data and a function for judging the formation amount of the metal silicide layer on the basis of the calculated saturation are made possible in the computer.

Another program according to the present invention is a program which is run by a computer and is program for judging the formation amount of a metal silicide layer by processing image data of the metal silicide layer, where a function for calculating hue of the metal silicide layer by processing the image data and a function for judging the formation amount of the metal silicide layer on the basis of the calculated hue are made possible in the computer.

According to the present invention as described above, the formation amount of the metal silicide layer is judged on the basis of the saturation or hue of the metal silicide layer, which makes it possible to efficiently inspect whether a metal silicide layer is sufficiently formed.

BRIEF DESCRIPTION OF DRAWINGS

In the accompanying drawings:

FIG. 9 is a flow chart for explaining a sixth example of a process performed by a saturation and hue calculating portion 30 and a judging portion 40;

FIGS. 10A and 10B are cross-sectional views each explaining a method according to Embodiment 1;

FIGS. 12A and 12B are cross-sectional views each explaining a step performed after steps of FIGS. 11A and 11B;

FIGS. 13A and 13B are cross-sectional views each explaining a step performed after steps of FIGS. 12A and 12B;

DETAILED DESCRIPTION OF THE INVENTION

Embodiment Mode

Figure 1:
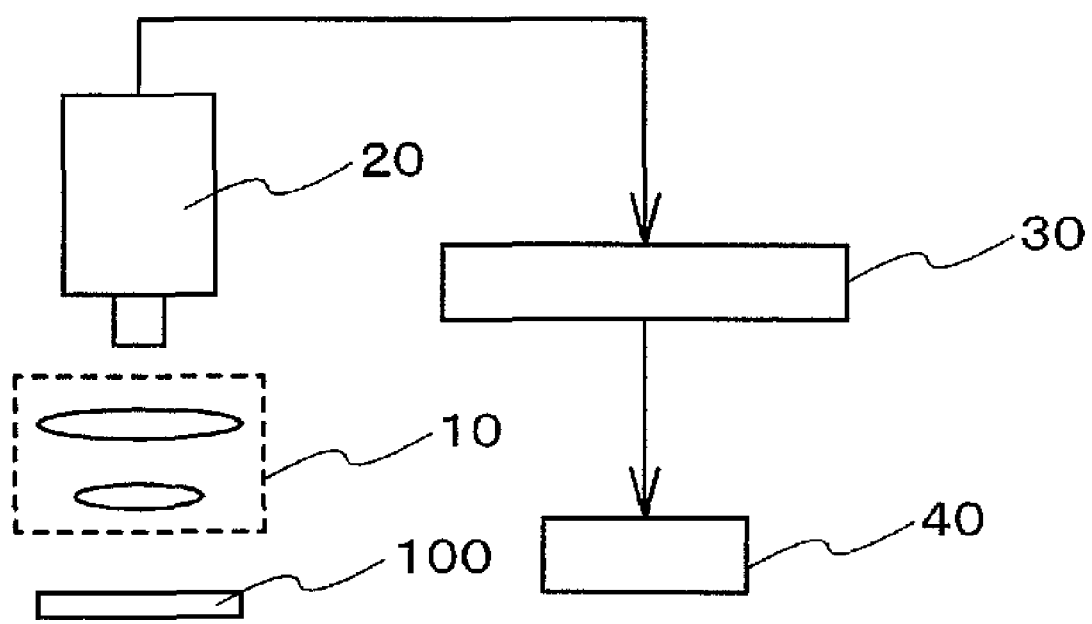
FIG. 1 is a schematic view for explaining a structure of a semiconductor inspection device according to Embodiment Mode.

Hereinafter, an embodiment mode of the present invention will be explained with reference to the drawings. FIG. 1 is a schematic view for explaining a structure of a semiconductor inspection device according to the embodiment mode of the present invention. This semiconductor inspection device inspects whether a metal silicide layer is sufficiently formed over a semiconductor layer.

This semiconductor inspection device has an optical system 10 for enlarging a metal silicide layer formed over a substrate 100, an imaging device 20 for performing color imaging of the image enlarged by the optical system 10, a saturation and hue calculating portion 30, and a judging portion 40.

The imaging device 20 has, for example, a CCD image pickup element or a MOS image pickup element and generates RGB image data of the image enlarged by the optical system 10. It is to be noted that the imaging device 20 may generate complimentary color image data of the image enlarged by the optical system 10.

The saturation and hue calculating portion 30 calculates saturation (for example, corrected saturation) and hue of the metal silicide layer with the use of RGB image data generated by the imaging device 20. It is to be noted that when the imaging device 20 generates complementary color image data, the saturation and hue calculating portion 30 calculates saturation and hue of the metal silicide layer after the saturation and hue calculating portion 30 converts this complementary color image data into RGB image data. The judging portion 40 judges whether the metal silicide layer is sufficiently formed on the basis of the saturation or hue calculated by the saturation and hue calculating portion 30. Details of processes performed by the saturation and hue calculating portion 30 and the judging portion 40 will be explained below with the use of flow charts.

Figure 2A:
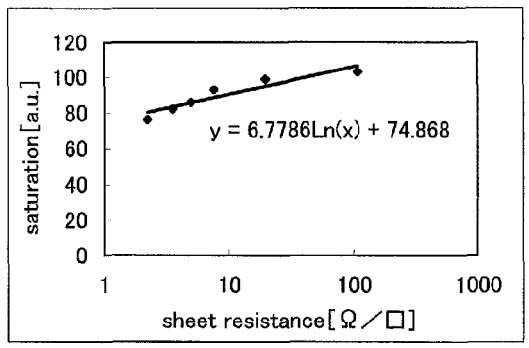
FIGS. 2A to 2C are a graph showing the correlation between saturation and sheet resistance of a metal silicide layer, a graph showing the correlation between hue and sheet resistance of a metal silicide layer, and a graph showing the correlation between a value of G-B and sheet resistance, respectively.

FIG. 2A is a graph showing the correlation between saturation and sheet resistance of a metal silicide layer. This graph shows measurement results of saturation and sheet resistance for a plurality of samples which is formed and has the metal silicide layer. A metal layer is formed over a silicon layer and this silicon layer and metal layer are heat-treated, whereby the plurality of samples which is used here is formed. The formation conditions of the silicon layers are the same for each of the plurality of samples; however, thicknesses of the metal layers differ for each of the plurality of samples. As shown in the graph, there exists a correlation between saturation and sheet resistance of the metal silicide layer. The judging portion 40 shown in FIG. 1 has an equation for the correlation between saturation and sheet resistance of the metal silicide layer. Therefore, the judging portion 40 can judge whether the sheet resistance of the metal silicide layer is lower than the reference value, that is, whether the metal silicide layer is sufficiently formed by substituting the saturation of the metal silicide layer into the equation for the correlation between saturation and sheet resistance. It is to be noted that it is necessary that an imaging condition for when the correlation equation is calculated and an imaging condition for when whether the sheet resistance is lower than the reference value is judged with the use of the correlation equation are the same.

Figure 2B:
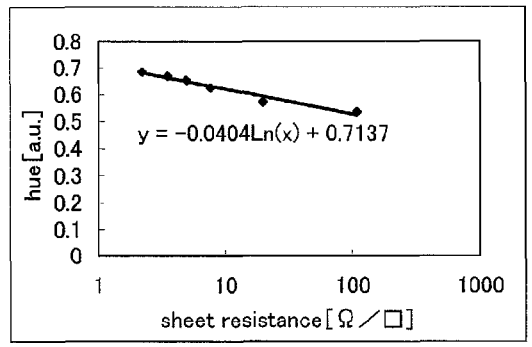

FIG. 2B is a graph showing the correlation between hue and sheet resistance of a metal silicide layer. This graph shows measurement results of hue and sheet resistance in a plurality of samples which is formed and has the metal silicide layer. A metal layer is formed over a silicon layer and this silicon layer and metal layer are heat-treated, whereby the plurality of samples which is used here is formed. The formation conditions of the silicon layers are the same for each of the plurality of samples; however, thicknesses of the metal layers differ for each of the plurality of samples. As shown in the graph, there exists a correlation between hue and sheet resistance of the metal silicide layer. The judging portion 40 shown in FIG. 1 has an equation for the correlation between hue and sheet resistance of the metal silicide layer. Therefore, the judging portion 40 can judge whether the sheet resistance of the metal silicide layer is lower than the reference value, that is, whether the metal silicide layer is sufficiently formed by substituting the hue of the metal silicide layer into the equation for the correlation between hue and sheet resistance. It is to be noted that it is necessary that an imaging condition for when the correlation equation is calculated and an imaging condition for when whether the sheet resistance is lower than the reference value is judged with the use of the correlation equation are the same.

Figure 2C:
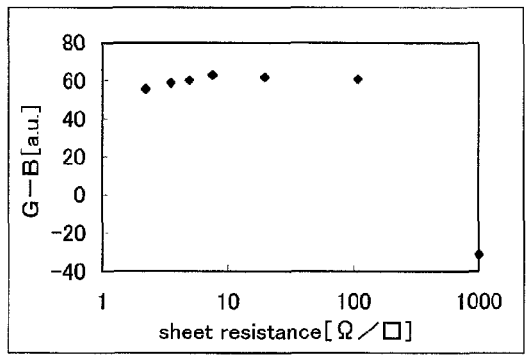

FIG. 2C is a graph showing a correlation between a value obtained by subtracting the average value of B from the average value of G (hereinafter, the value obtained from G-B) among RGB data which is generated by imaging the metal silicide layer with an imaging device and sheet resistance. This graph shows a measurement result of the metal layer in which a pattern is not formed. In a case with a semiconductor layer (for example, a silicon layer) only, sheet resistance is extremely high and cannot be measured, so it is temporally set as $1000[\Omega/\square]$ in this graph. When the sheet resistance is extremely high, that is, when the semiconductor layer is not silicified, the value obtained from G-B becomes negative; however, in other case, that is, when the metal silicide layer is formed, the value obtained from G-B becomes positive. Therefore, by calculating the value of G-B, a sample in which the metal silicide layer is not formed can be selected.

Figure 3A:
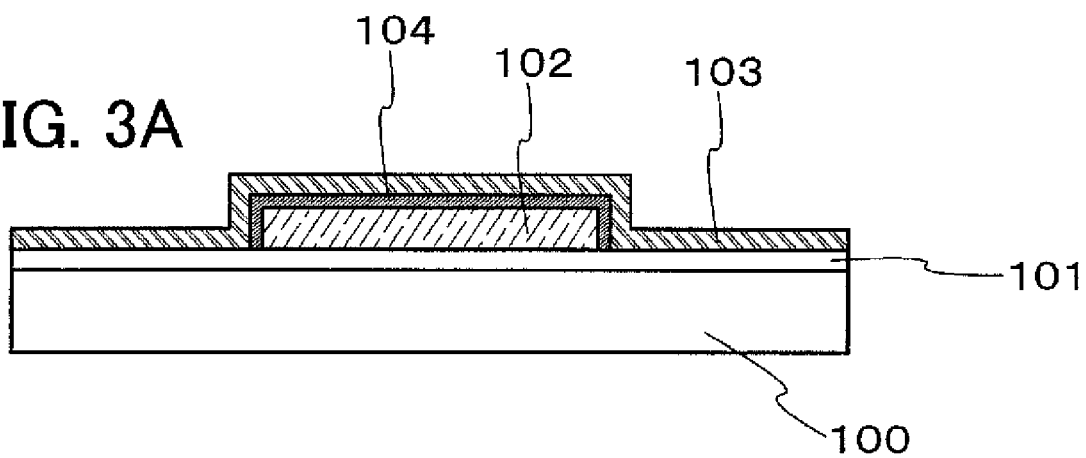
FIGS. 3A and 3B are cross-sectional views each explaining a method for forming a metal silicide layer over a substrate 100.
Figure 3B:
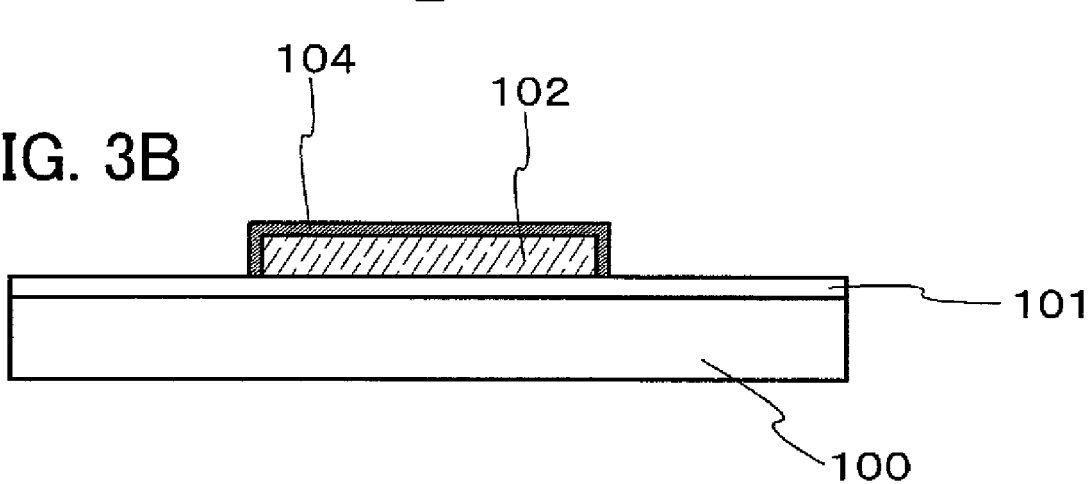

Each of FIGS. 3A and 3B is a cross-sectional view for explaining a method for forming a metal silicide layer over a substrate 100. As shown in FIG. 3A, a base insulating film 101 is formed over the substrate 100 by a CVD method. The substrate 100 is, for example, a glass substrate, a quartz substrate, a substrate formed of an insulating substance such as alumina, or a plastic substrate having heat resistance to the processing temperature of subsequent steps. The base insulating film 101 may have a single-layered structure of a silicon oxide film or a two-layered structure in which a silicon nitride film is formed over a silicon oxide film.

Subsequently, a semiconductor film is formed over the base insulating film 101 by a CVD method, for example. This semiconductor film is formed of a material containing silicon, such as silicon or silicon-germanium-carbon, which enables formation of metal silicide. When the semiconductor film is a polysilicon film, for a method of forming the polysilicon film, there is a method in which a polysilicon film is directly formed on a substrate or a method in which an amorphous silicon film is formed and then crystallized. Then, a photoresist film (not shown) is applied over the semiconductor film and this photoresist film is exposed and developed. Accordingly, a resist pattern is formed over the semiconductor film. Next, the semiconductor film is etched by using this resist pattern as a mask, whereby a semiconductor layer 102 is formed over the base insulating film 101. The semiconductor layer 102 may have an island-shape or a shape to be a wiring. Then, an impurity is injected into the semiconductor layer 102 to lower resistance.

Next, a metal film 103 is formed over the semiconductor layer 102 and the base insulating film 101 by a sputtering method. Although a nickel film is used as the metal film 103, for example, a titanium film or a cobalt film may also be used. Next, the metal film 103 and the semiconductor layer 102 are heat-treated by an RTA method. For example, a heating temperature is preferably greater than or equal to 350° C. and less than or equal to 700° C. and more preferably greater than or equal to 400° C. and less than or equal to 650° C. Accordingly, a metal silicide layer 104 is formed over a surface of the semiconductor layer 102.

Subsequently, as shown in FIG. 3B, the metal film 103 which is not silicified is removed by wet etching, for example. Thereafter, with the use of the imaging device 20 of the semiconductor inspection device shown in FIG. 1, the metal silicide layer 104 is imaged and RGB image data of the metal silicide layer 104 is generated. Then, the semiconductor inspection device judges whether the metal silicide layer 104 is sufficiently formed with the use of the saturation and hue calculating portion 30 and the judging portion 40.

Figure 4:
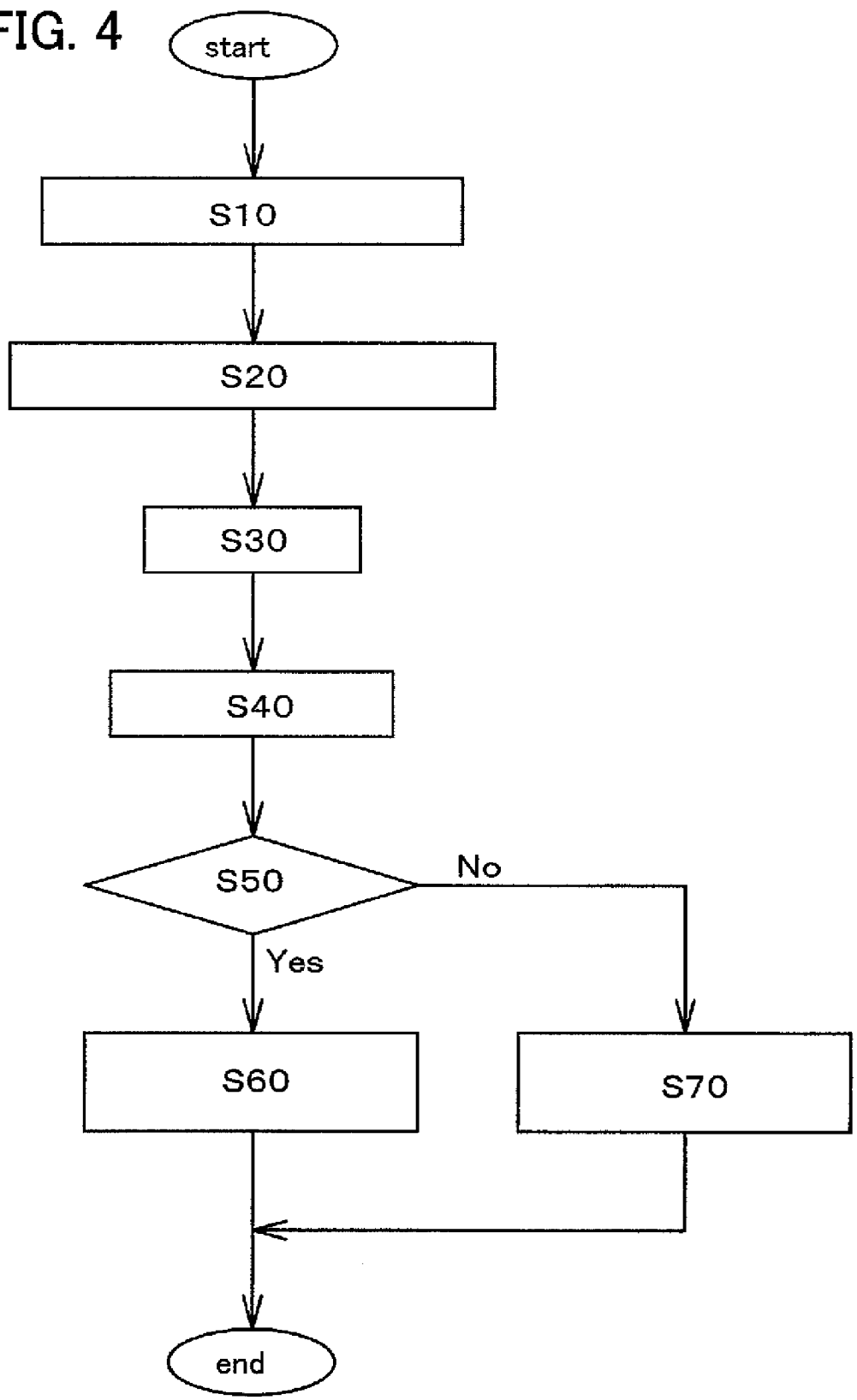
FIG. 4 is a flow chart for explaining a first example of a process performed by a saturation and hue calculating portion 30 and a judging portion 40.

FIG. 4 is a flow chart for explaining a first example of a process performed by the saturation and hue calculating portion 30 and the judging portion 40. The imaging device 20 generates RGB data of the metal silicide layer 104 (S10), and then the saturation and hue calculating portion 30 calculates average values of R, G, and B of the RGB data (S20). The average value of R is obtained by adding the value of R for each pixel of the obtained image and dividing the value by the number of pixels. The average value of G and the average value of B are obtained in a similar manner. The average value of G is obtained by adding the value of G for each pixel of the obtained image and dividing the value by the number of pixels. The average value of B is obtained by adding the value of B for each pixel of the obtained image and dividing the value by the number of pixels. Then, the saturation and hue calculating portion 30 substitutes each of the obtained average values of R, G, and B into the following Formula 1, which is generally known, whereby saturation $Q_c$ of the metal silicide layer is calculated (S30).

$$Qc = \sqrt{\left(\frac{2R-G-B}{2}\right)^2 + \left(\frac{\sqrt{3}(G-B)}{2}\right)^2}$$ [Formula 1]

Next, the judging portion 40 substitutes the saturation $Q_c$ calculated by the saturation and hue calculating portion 30 into an equation for the correlation between sheet resistance and saturation of a metal silicide layer, whereby sheet resistance of the metal silicide layer 104 is calculated (S40). The correlation equation which is used here is calculated by the following method, for example. First, metal films with each sample having a different thickness are formed over a silicon layer formed under the same formation condition as that of the metal silicide layer 104 of which measurement is desired and the samples are heat-treated, whereby a metal silicide layer is formed. Sheet resistance and saturation of the metal silicide layer of each sample are measured, whereby the correlation equation is obtained. When the calculated sheet resistance is less than or equal to the reference value (S50: Yes), the judging portion 40 judges that the metal silicide layer 104 is sufficiently formed (S60). When the calculated sheet resistance is greater than the reference value (S50: No), the judging portion 40 judges that the metal silicide layer 104 is not sufficiently formed (S70).

As described above, according to the first example, processing the RGB image data of the metal silicide layer 104 generated by the imaging device 20 by the saturation and hue calculating portion 30 and the judging portion 40 makes it possible to efficiently judge whether the metal silicide layer 104 is sufficiently formed. In addition, the occurrence of variations in judgment results can be suppressed.

Figure 5:
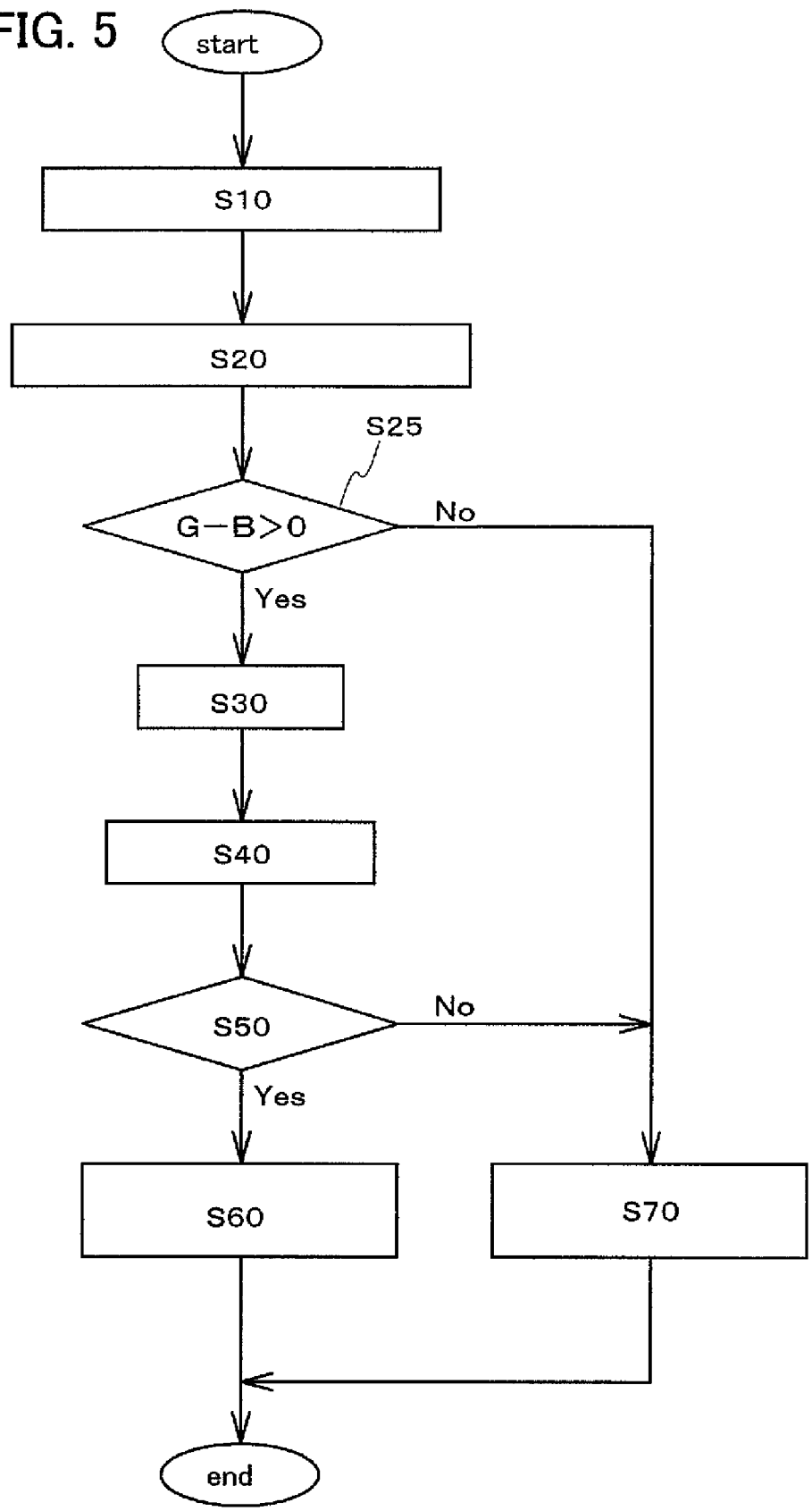
FIG. 5 is a flow chart for explaining a second example of a process performed by a saturation and hue calculating portion 30 and a judging portion 40.

FIG. 5 is a flow chart for explaining a second example of the process performed by the saturation and hue calculating portion 30 and the judging portion 40. The second example is similar to the first example except that the processes after S30 of the first example are performed only when the average value of G is larger than the average value of B (S25: Yes). When the average value of G is smaller than the average value of B (S25: No), as explained with the use of FIG. 2C, it can be judged that the metal silicide layer 104 is not formed (S70). Hereinafter, the same numbers are used for processes which are the same as those in the first example, and explanations thereof are omitted.

An effect which is similar to the effect obtained in the first example can be obtained in the second example, as well. In addition, when the metal silicide layer is not formed, the relation between saturation and sheet resistance deviates from the result of the correlation equation. However, in this embodiment mode, only when the average value of G is larger than the average value of B (S25: Yes) can it be judged accurately whether the metal silicide 104 layer is sufficiently formed in order for the processes after S30 in the first example to be performed. Also, it can be judged further efficiently whether the metal silicide layer 104 is sufficiently formed.

Figure 6:
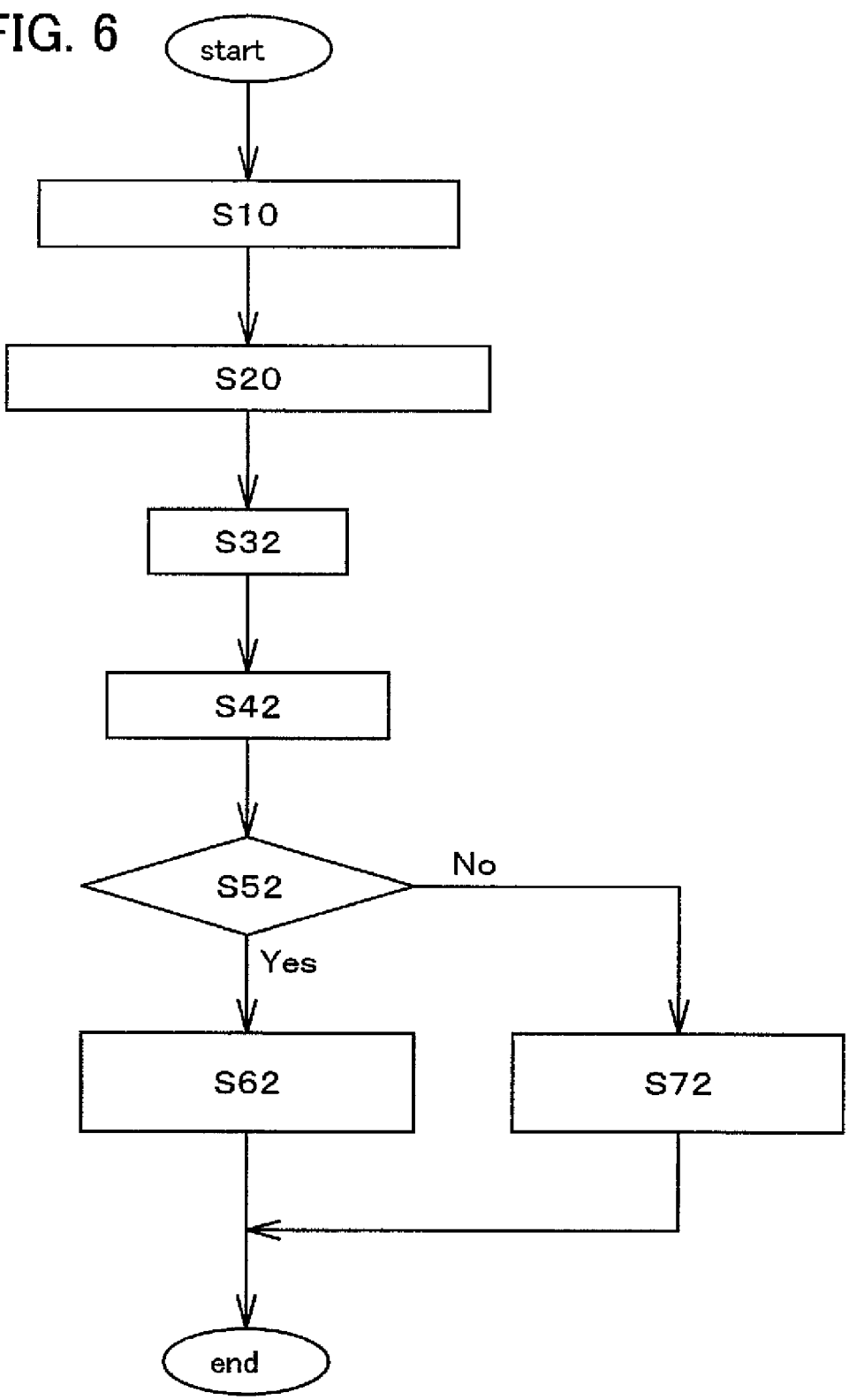
FIG. 6 is a flow chart for explaining a third example of a process performed by a saturation and hue calculating portion 30 and a judging portion 40.

FIG. 6 is a flow chart for explaining a third example of the process performed by the saturation and hue calculating portion 30 and the judging portion 40. In the third example, the judging portion 40 judges whether the metal silicide layer is sufficiently formed with the use of hue.

The imaging device 20 generates RGB image data of the metal silicide layer 104 (S10), the saturation and hue calculating portion 30 calculates average values of R, G, and B of the RGB image data (S20), and then the saturation and hue calculating portion 30 substitutes each of the average values of the calculated R, G, and B into the following Formula 2, which is generally known, whereby a hue H of the metal silicide layer is calculated (S32).

$$H = \cos^{-1}\left\{\frac{(R-G)+(R-B)}{2\sqrt{(R-G)^2+(R-B)(G-B)}}\right\}$$ [Formula 2]

Next, the judging portion 40 substitutes the hue H calculated by the saturation and hue calculating portion 30 into an equation for the correlation between sheet resistance and saturation of a metal silicide layer, whereby sheet resistance of the metal silicide layer 104 is calculated (S42). The correlation equation which is used here is calculated by the following method, for example. First, metal films with each sample having a different thickness are formed over a silicon layer formed under the same formation condition as that of the metal silicide layer 104 of which measurement is desired and the samples are heat-treated, whereby a metal silicide layer is formed. Sheet resistance and hue of the metal silicide layer of each sample are measured, whereby the correlation equation is obtained. When the calculated sheet resistance is less than or equal to the reference value (S52: Yes), the judging portion 40 judges that the metal silicide layer 104 is sufficiently formed (S62). When the calculated sheet resistance is greater than the reference value (S52: No), the judging portion 40 judges that the metal silicide layer 104 is not sufficiently formed (S72).

It can be efficiently judged whether the metal silicide layer 104 is sufficiently formed in this embodiment mode, as well. In addition, the occurrence of variations in the judgment results can be suppressed.

Figure 7:
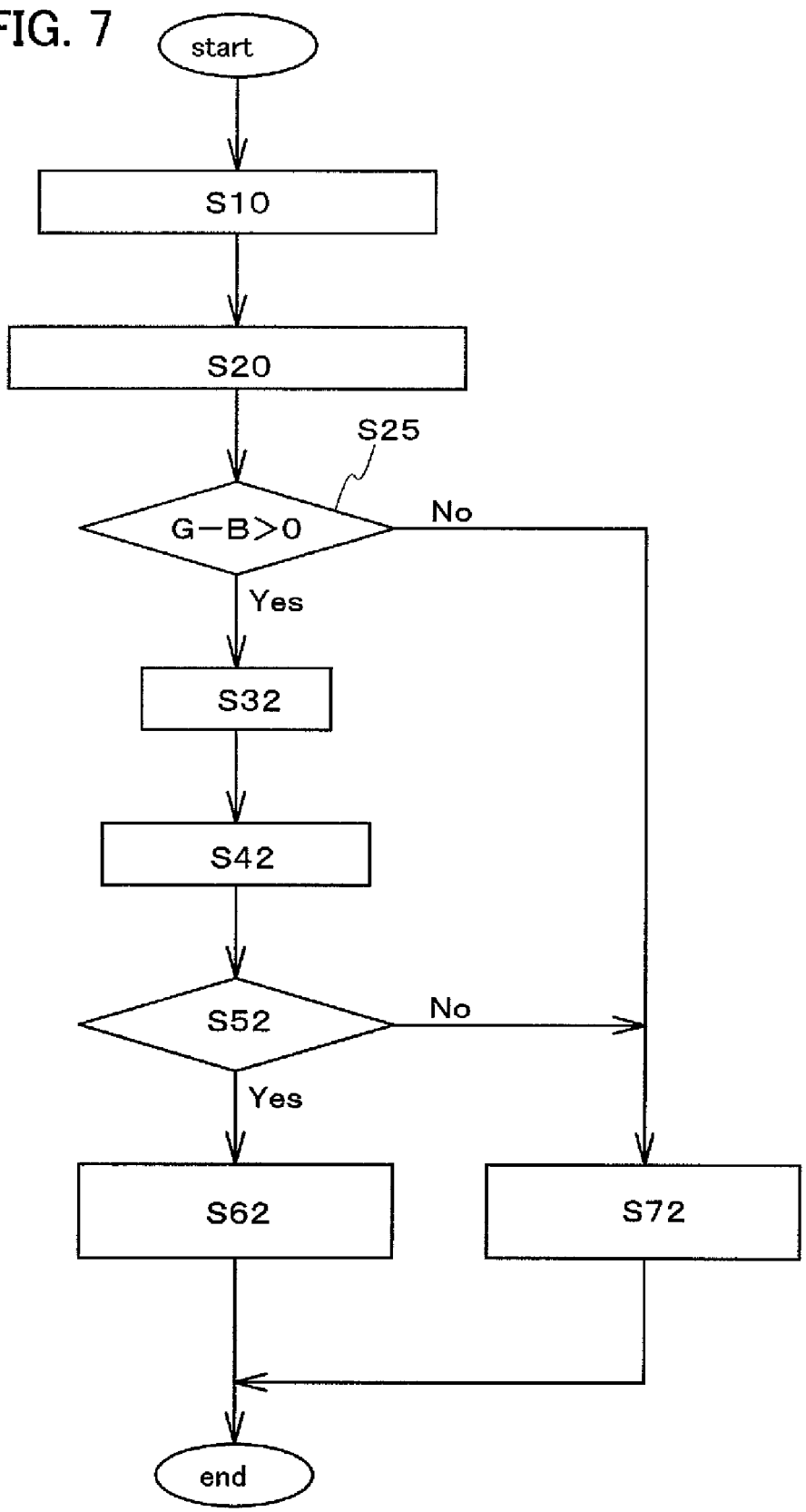
FIG. 7 is a flow chart for explaining a fourth example of a process performed by a saturation and hue calculating portion 30 and a judging portion 40.

FIG. 7 is a flow chart for explaining a fourth example of a process performed by the saturation and hue calculating portion 30 and the judging portion 40. The fourth example is similar to the third example except that processes after S32 of the third example are performed only when the average value of G is larger than the average value of B (S25: Yes). When the average value of G is smaller than the average value of B (S25: No), as explained with the use of FIG. 2C, it can be judged that the metal silicide layer 104 is not formed (S72). Hereinafter, the same numbers are used for the processes which are the same as those in the third example, and explanations thereof are omitted.

An effect which is similar to the effect obtained in the third example can be obtained in the fourth example, as well. In addition, when the metal silicide layer is not formed, the relation between hue and sheet resistance deviates from the results of the correlation equation. However, in this embodiment mode, only when the average value of G is larger than the average value of B (S25: Yes) can it be judged accurately whether the metal silicide 104 layer is sufficiently formed in order for the processes after S32 in the third example to be performed. Also, it can be judged further efficiently whether the metal silicide layer 104 is sufficiently formed.

Figure 8:
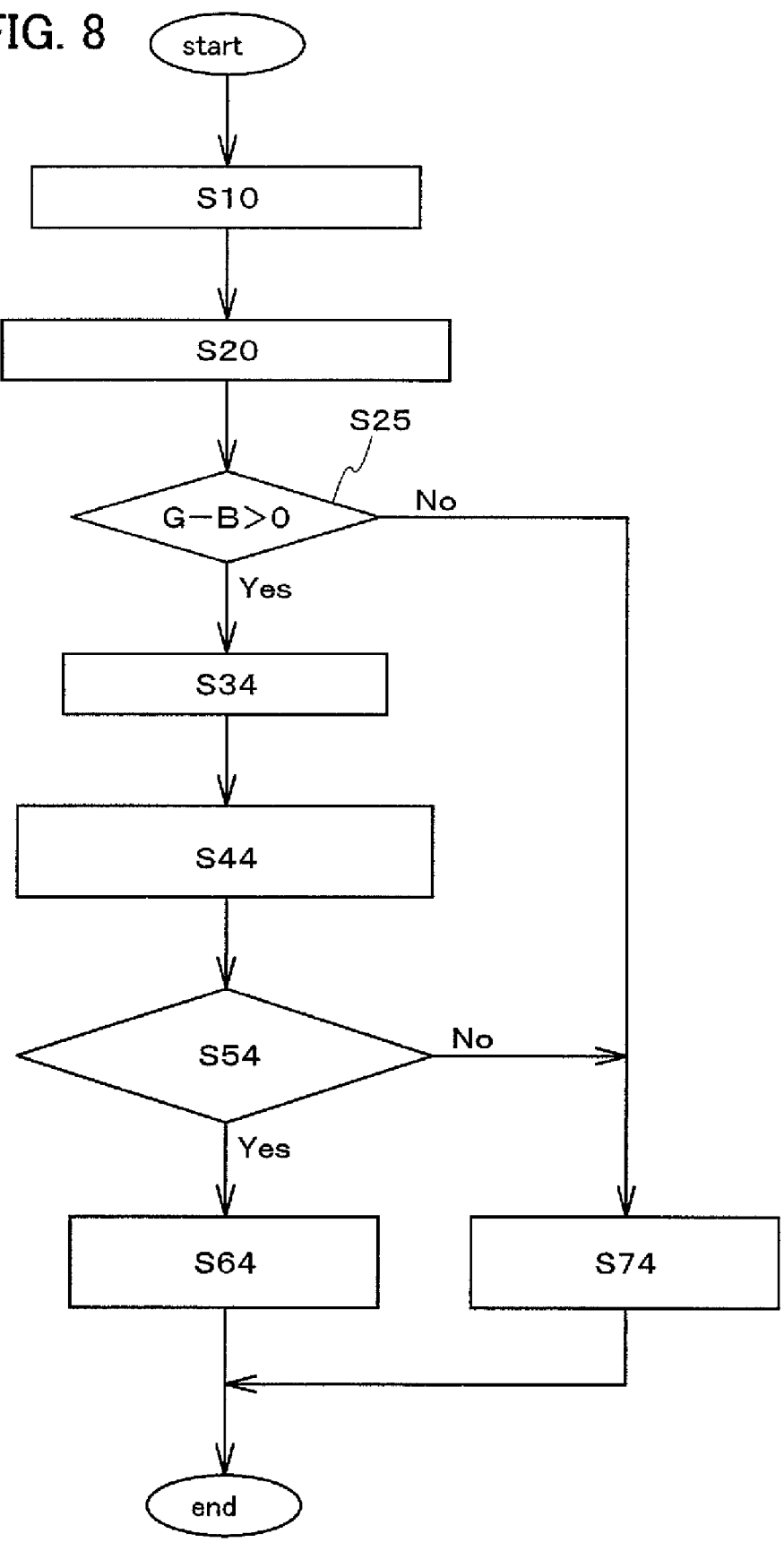
FIG. 8 is a flow chart for explaining a fifth example of a process performed by a saturation and hue calculating portion 30 and a judging portion 40.

FIG. 8 is a flow chart for explaining a fifth example of the process performed by the saturation and hue calculating portion 30 and the judging portion 40. The imaging device 20 generates RGB image data of the metal silicide layer 104 (S10) and the saturation and hue calculating portion 30 calculates average values of R, G, and B of the RGB image data (S20). Then, when the average value of G is smaller than the average value of B (S25: No), it is judged that the metal silicide layer 104 is not formed. When the average value of G is larger than the average value of B (S25: Yes), the saturation and hue calculating portion 30 substitutes each of the calculated average values of R, G, and B into each of the above Formula 1 and Formula 2, whereby saturation $Q_c$ and a hue H of the metal silicide layer are calculated (S34).

Subsequently, the judging portion 40 substitutes the calculated saturation $Q_c$ into an equation for the correlation between sheet resistance and saturation of a metal silicide layer, whereby sheet resistance of the metal silicide layer is calculated, and also the judging portion 40 substitutes the calculated hue H into an equation for the correlation between sheet resistance and hue of the metal silicide layer, whereby sheet resistance of the metal silicide layer 104 is calculated (S44). A metal silicide film with a large area is formed by the same method and under the same formation condition as those of the metal silicide layer 104, and sheet resistance, saturation, and hue of the metal silicide film are measured, whereby these correlation equations are calculated. Then, the judging portion 40 calculates an average value of the two calculated sheet resistances and judges whether the calculated average value is less than or equal to the reference value (S54). When the calculated average value is less than or equal to the reference value (S54: Yes), the judging portion 40 judges that the metal silicide layer 104 is sufficiently formed (S64) and when the calculated average value is greater than the reference value (S54: No), the judging portion 40 judges that the metal silicide layer 104 is not sufficiently formed (S74).

It can be efficiently judged whether the metal silicide layer 104 is sufficiently formed in this example, as well. In addition, the occurrence of variations in judgment results can be suppressed.

FIG. 9 is a flow chart for explaining a sixth example of the process performed by the saturation and hue calculating portion 30 and the judging portion 40. The imaging device 20 generates RGB image data of the metal silicide layer 104 (S10) and the saturation and hue calculating portion 30 calculates average values of R, G, and B of the RGB image data (S20). Then, the saturation and hue calculating portion 30 substitutes each of the average values of R, G, and B into the above Formula 2, whereby a hue H of the metal silicide layer 104 is calculated (S32). Subsequently, the judging portion 40 substitutes the calculated hue H into an equation for the correlation between sheet resistance and hue of a metal silicide layer, whereby sheet resistance of the metal silicide layer 104 is calculated (S42).

When the sheet resistance calculated by the judging portion 40 is greater than the reference value (S52: No), the judging portion 40 judges that the metal silicide layer 104 is not sufficiently formed (S76) and the process is terminated.

When the sheet resistance calculated by the judging portion 40 is less than or equal to the reference value (S52: Yes), the saturation and hue calculating portion 30 substitutes each of the calculated average values of R, G, and B into the above Formula 1, whereby saturation $Q_c$ of the metal silicide layer 104 is calculated (S56).

Subsequently, the judging portion 40 substitutes the calculated saturation $Q_c$ into an equation for the correlation between sheet resistance and saturation of a metal silicide layer, whereby sheet resistance of the metal silicide layer 104 is calculated. Then, the average value of the sheet resistance calculated from the saturation $Q_c$ and the sheet resistance calculated from the hue H is calculated and it is judged whether the calculated average value is less than or equal to the reference value (S58). When the calculated average value is less than or equal to the reference value (S58: Yes), it is judged that the metal silicide layer 104 is sufficiently formed (S66) and when the calculated average value is greater than the reference value (S58: No), it is judged that the metal silicide layer 104 is not sufficiently formed (S76).

It can be efficiently judged whether the metal silicide layer 104 is sufficiently formed in this example, as well.

In addition, when the metal silicide layer 104 is not formed, the relation between saturation and sheet resistance deviates from the results of the correlation equation. However, in this embodiment mode, first, sheet resistance is calculated from the hue H and it is judged whether the metal silicide layer 104 is sufficiently formed on the basis of this sheet resistance. Only when the metal silicide layer 104 is sufficiently formed is the sheet resistance calculated on the basis of the saturation $Q_c$, and an average value of the two sheet resistance values is set as a final sheet resistance value. Therefore, it can be judged accurately whether the metal silicide layer 104 is sufficiently formed.

It is to be noted that the saturation and hue calculating portion 30 and the judging portion 40 are made possible through installation of a program having the above function on a computer system. For example, this program is installed on the computer system through a recording medium. Although, for example, a removable disk, such as a floppy disk (registered trademark), CD-ROM, CD-R, CD-R/W, DVD-RAM, MO, and semiconductor memory, or a hard disk, is used as a recording medium for storing the program, others may also be used as the recording medium. In addition, this program may be installed on the computer system by being downloaded through a communication line such as internet.

As described above, according to this embodiment mode, it can be judged whether the metal silicide layer 104 is sufficiently formed and the occurrence of variations in judgment results can be suppressed. In addition, inspection can be made possible by adding the saturation and hue calculating portion 30 and the judging portion 40 to a conventional device and nondestructive inspection can be carried out; therefore, shortening of steps, early detection of defects, improvement of quality control, and reduction in costs can be obtained in comparison with a conventional evaluation method.

Further, it is well known that as the thickness of a metal film increases, the sheet resistance decreases. Therefore, in the above Embodiment Mode, an equation expressing the relation between saturation and thickness of a metal silicide layer may be used instead of Formula 1 and an equation expressing the relation between hue and thickness of a metal silicide layer may also be used instead of Formula 2. In this case, the judging portion 40 calculates thickness instead of sheet resistance of the metal silicide layer. Then, when the calculated thickness is greater than or equal to or greater than the reference value, it is judged that the metal silicide layer is sufficiently formed and when the calculated thickness is less than or less than or equal to the reference value, it is judged that the metal silicide layer is not sufficiently formed.

Embodiment 1

In Embodiment 1, a process in which a crystalline semiconductor film 201 is formed over a substrate 400 and a top gate TFT is manufactured with the use of the crystalline semiconductor film 201 will be explained.

First, as shown in FIG. 10A, a silicon nitride oxide film 401 and a silicon oxynitride film 402 are formed in this order over the substrate 400. Then, a semiconductor film 201 is formed over the silicon oxynitride film 402. As the substrate 400, a glass substrate, a quartz glass substrate, a substrate formed of an insulating material such as alumina, a plastic substrate having heat resistance to the processing temperature of subsequent steps, and the like can be used. It is to be noted that the substrate to be used is preferably a substrate which transmits visible light and has a little wavelength dependence of transmittance or reflectance of the visible light. The silicon nitride oxide film 401 and the silicon oxynitride film 402 are formed in order to prevent an impurity such as sodium from dispersing in the semiconductor film 201.

As the semiconductor film 201, a material, such as silicon and silicon-germanium-carbon, which enables formation of Ni silicide can be used. Also, the semiconductor film 201 may be any of an amorphous semiconductor film, a crystalline semiconductor film, and a single crystal semiconductor film.

In the following description, the case of using the crystalline semiconductor film 201 as the semiconductor film 201 will be explained. As a formation method of the crystalline semiconductor film 201, there is a method in which the crystalline semiconductor film 201 is formed directly on the silicon oxynitride film 402 or a method in which an amorphous semiconductor film is formed over the silicon oxynitride film 402 and then crystallized.

As a crystallizing method of the amorphous semiconductor film, the following methods can be used: a method in which laser light is emitted, a method in which an amorphous semiconductor film is crystallized by heat treatment with the use of an element for promoting crystallization of a semiconductor film, and a method in which an amorphous semiconductor film is crystallized by heat treatment with the use of an element for promoting crystallization of a semiconductor film and then laser light is emitted.

In this embodiment, a method in which an amorphous semiconductor film is crystallized by heat treatment with the use of an element for promoting crystallization of the amorphous semiconductor film and then laser light is emitted will be explained.

First, an amorphous silicon film is formed over the silicon oxynitride film 402 by a plasma CVD method.

Subsequently, a metal-containing layer is formed over a surface of the amorphous semiconductor film. The metal-containing layer contains a metal element having catalyst action which promotes crystallization of a semiconductor film (for example, one kind or plural kinds selected from Fe, Ni, Ru, Rh, Pd, Os, Ir, Pt, Cu, and Au). In a case where the metal element is Ni, for example, a nickel acetate solution containing nickel of 1 to 100 ppm by weight conversion is applied (for example, spin-coated), whereby the metal-containing layer is formed. It is to be noted that as a formation method of the metal-containing layer, there is a sputtering method, an evaporation method, or a method for forming an extremely thin film by plasma treatment in addition to application. Although an example in which the metal-containing layer is formed over an entire surface is shown here, the metal-containing layer may be selectively formed with the use of a mask. In addition, the metal-containing layer may be formed before formation of the amorphous semiconductor film, that is, under the amorphous semiconductor film.

Next, the substrate 400, the silicon nitride oxide film 401, the silicon oxynitride film 402, the amorphous semiconductor film, and the metal-containing layer are heat-treated. Then, an alloy of a metal element and a semiconductor is formed in the semiconductor and crystallization of the amorphous semiconductor film proceeds using this alloy as a core, whereby a semiconductor film having a crystal structure, that is, the crystalline semiconductor film 201 is formed. It is to be noted that concentration of oxygen contained in the crystalline semiconductor film 201 is preferably less than or equal to $5 \times 10^{18}/cm^3$. Here, after heat treatment for dehydrogenating (at 450 to 500° C., for 1 to 2 hours), heat treatment for crystallization (at 550 to 650° C., for 4 to 24 hours) is performed.

The amorphous semiconductor film can be crystallized by being irradiated with intense light. Although any one of infrared light, visible light, and ultraviolet light or a combination of these can be used in this case, light emitted from a halogen lamp, a metal hydride lamp, a xenon arc lamp, a carbon arc lamp, a high-pressure sodium lamp, or a high-pressure mercury lamp is typically used. A lamp source is lighted for 1 to 60 seconds, preferably 30 to 60 seconds and this is repeated for 1 to 10 times, preferably 2 to 6 times. The emission intensity of the lamp source is arbitrary and the semiconductor film is heated instantaneously to approximately 600 to 1000° C. It is to be noted that heat treatment by which hydrogen contained in the amorphous semiconductor film having an amorphous structure may be performed, if necessary. In addition, crystallization may be performed by performing both heat treatment and irradiation of intense light.

Although an oxide film is formed over a surface of the crystalline semiconductor film 201 in the above heat treatment or step in which intense light is emitted, it is preferable that this oxide film be removed by etching before the next step.

Then, the crystalline semiconductor film 201 is irradiated with laser light under atmosphere pressure in order to increase degree of crystallinity (a ratio of a crystalline component in a whole volume of the film) and repair a defect remaining in a crystal grain.

As laser light, an excimer laser, a YAG laser, a $YVO_4$ laser, a YLF laser, a $YAlO_3$ laser, a glass laser, a ruby laser, an alexandrite laser, a sapphire laser, or the like which is pulse oscillation or continuous oscillation with a wavelength of 400 nm or more can be used. Light emitted from an ultraviolet lamp may also be used instead of such laser light.

When the above laser is used, laser light emitted from a laser oscillator may be converged to be linear with an optical system and the crystalline semiconductor film 201 may be irradiated with the laser light. Crystallization conditions are appropriately selected by a practitioner. However, when a pulse oscillation excimer laser is used, for example, the pulsed repetition rate is 30 Hz and the laser energy density is 100 to 500 mJ/cm². In addition, when a pulse oscillation YAG laser or $YVO_4$ laser is used, it is preferable that a pulse repetition rate be 1 to 10 kHz and the laser energy density be 300 to 600 mJ/cm² with the use of a second harmonic or a third harmonic. Then, laser light converged to be linear with the width of 100 to 1000 µm, for example, 400 µm, is emitted to an entire surface of the crystalline semiconductor film 201. It is preferable to set an overlap rate of the laser light to be 80 to 98% at this time. In addition, laser light with a repetition rate of 1 to 10 MHz can also be used.

When a continuous oscillation laser (for example, a continuous oscillation $YVO_4$ laser) is used, laser light emitted from the continuous oscillation YVO$_4$ laser having output of 10 W is converted to a high harmonic (a second harmonic to a fourth harmonic) by a nonlinear optical element. In addition, a method in which a YVO$_4$ crystal and the nonlinear optical element is put in an oscillator and a harmonic is emitted. Then, it is preferable that the harmonic be formed into oblong or elliptical laser light at an irradiation surface by an optical system and be emitted to the crystalline semiconductor film 201. At this time, an energy density of approximately 0.001 to 100 MW/cm$^2$ (preferably, 0.1 to 10 MW/cm$^2$) is necessary. Then, the laser light is emitted to the semiconductor film at a rate of approximately 0.5 to 2000 cm/s while relatively transferring the semiconductor film with respect to the laser light.

Subsequently, by processing a surface of the crystalline semiconductor film 201 with an ozone containing solution (typically, ozone water), an oxide film (referred to as chemical oxide) is formed over the surface of the crystalline semiconductor film 201. Accordingly, a barrier layer 202 formed of the oxide film with a thickness of 1 to 10 nm in total is formed. The barrier layer 202 serves as an etching stopper when only a gettering layer is selectively removed in a subsequent step.

Here, the barrier layer 202 (chemical oxide) can be formed even by processing with a solution containing hydrogen peroxide solution instead of an ozone containing solution. In addition, the barrier layer 202 may be formed by generating ozone by ultraviolet ray irradiation under an oxygen atmosphere and oxidation of the surface of the crystalline semiconductor film 201. Moreover, an oxide film with a thickness of approximately 1 to 10 nm may be formed by a plasma CVD method, a sputtering method, an evaporation method, or the like as the barrier layer 202.

Subsequently, a gettering layer 203 containing a rare gas element is formed over the barrier layer 202 as a gettering site. Here, an amorphous semiconductor film containing an argon gas is formed by a sputtering method as the gettering layer 203. When the gettering layer 203 is formed, sputtering conditions are appropriately adjusted so that the rare gas element is added. As the rare gas element, one kind or plural kinds selected from helium (He), neon (Ne), argon (Ar), krypton (Kr), and xenon (Xe).

There are two purposes of a rare gas element ion which is an inert gas contained in the gettering layer 203: one is to form a dangling bond and give distortion to a semiconductor film included in the gettering layer 203, and the other is to give distortion between lattices of the semiconductor film. It is preferable to use an element which has a larger atomic radius than that of an element (for example, silicon) included in the semiconductor film, such as argon (Ar), krypton (Kr), and xenon (Xe) in order to give distortion between the lattices of the semiconductor film. When the rare gas element is contained in the semiconductor film included in the gettering layer 203, not only distortion of the lattice is generated but also unpaired bond is formed; therefore, gettering ability of the gettering layer 203 is further improved.

Further, gettering can be performed utilizing coulomb force of phosphorus in addition to gettering with the rare gas element in a case where the gettering layer 203 is formed using a material gas containing phosphorous which is an impurity element having one conductivity type, a case where the gettering layer 203 is formed using a target containing phosphorous, or the like. Since a metal element (for example, nickel) tends to move to a region with high oxygen concentration in gettering, it is preferable that oxygen concentration contained in the gettering layer 203 be greater than or equal to 5×10$^{18}$/cm$^3$, for example.

Next, the crystalline semiconductor film 201, the barrier layer 202, and the gettering layer 203 are heat-treated (for example, heat treatment or a treatment of emitting intense light). Accordingly, as shown by arrows in FIG. 10A, a metal element (for example, nickel) is gettered, and concentration of the metal element contained in the crystalline semiconductor film 201 is lowered or the metal element is removed.

Then, as shown in FIG. 10B, only the gettering layer 203 is selectively removed by etching, by using the barrier layer 202 as an etching stopper. Thereafter, the barrier layer 202 formed of the oxide film is removed by etchant containing hydrofluoric acid. Through the above steps, the crystalline semiconductor film 201 can be obtained.

Figure 11A:
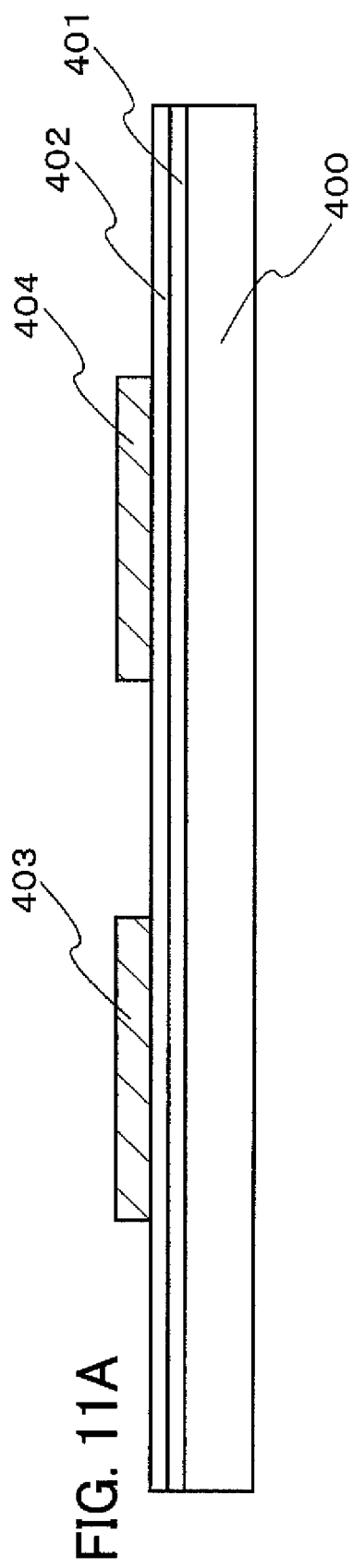
FIGS. 11A and 11B are cross-sectional views each explaining a step performed after steps of FIGS. 10A and 10B.

Subsequently, as shown in FIG. 11A, the crystalline semiconductor film 201 is selectively removed by a photolithography step, whereby island-shaped crystalline semiconductor films 403 and 404 are obtained.

Figure 11B:
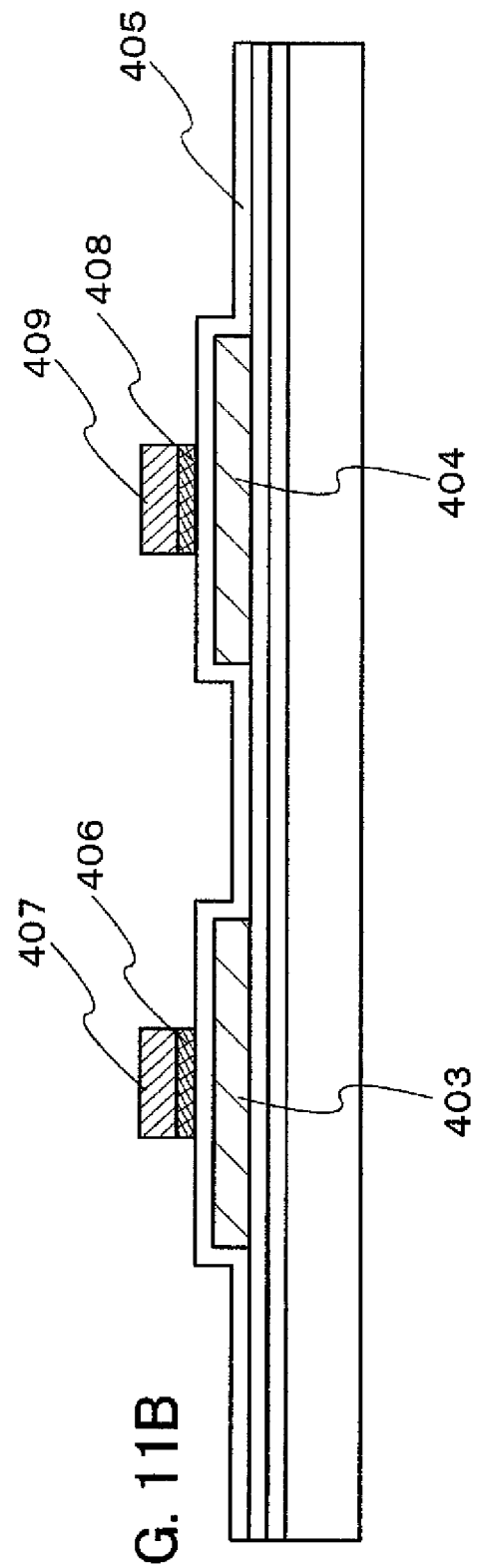

Next, as shown in FIG. 11B, after surfaces of the crystalline semiconductor films 403 and 404 are cleaned with etchant containing hydrofluoric acid, a gate insulating film 405 is formed so as to cover the crystalline semiconductor films 403 and 404. The gate insulating film 405 is formed of an insulating film containing silicon as its main component. It is desirable that the above surface cleaning step and formation step of the gate insulating film 405 be continuously performed without being exposed to the air.

Then, after a surface of the gate insulating film 405 is cleaned, a metal film containing Al, Cu, W, and the like as its main component is formed over the gate insulating film 405. A photoresist film (not shown) is formed over this metal film and exposed and developed, whereby a resist pattern is formed. The metal film is etched by using this resist pattern as a mask, whereby electrodes 406 to 409 are formed over the gate insulating film 405. Although FIG. 11B shows a two-layered gate electrode in which the second electrode 407 is stacked over the first electrode 406 and a two-layered gate electrode in which the second electrode 409 is stacked over the first electrode 408, the gate electrode may have a single-layered structure and a stacked-layer structure. Here, TaN is used for the first electrodes 406 and 408, and W (tungsten) is used for the second electrodes 407 and 409. Thereafter, the resist pattern is removed.

In addition, in a case where a material, such as silicon, which is capable of formation of Ni silicide is used as a material for the gate electrode, Ni silicide can also be formed over the gate electrode in a silicification step described later. For example, a crystalline semiconductor film or an amorphous semiconductor film imparting conductivity is formed over an entire surface of the gate insulating film, and thereafter this conductive film becomes a gate electrode by a known photolithography step, and then Ni silicide is also be formed over the gate electrode in a silicification step described later.

Next, as shown in FIG. 12A, a mask 410 formed of a resist is formed anew by a photolithography method. Subsequently, an impurity element imparting N-type (for example, phosphorous) is added to the crystalline semiconductor film 403 by an ion doping method using the mask 410, whereby N-type impurity regions 411 and 412 are formed.

Next, as shown in FIG. 12B, the mask 410 is removed and a mask 413 formed of a resist is formed anew by a photolithography method. Subsequently, an impurity element imparting P-type (for example, boron) is added to the crystalline semiconductor film 404 by an ion doping method using the mask 413, whereby P-type impurity regions 414 and 415 are formed.

Then, as shown in FIG. 13A, the mask 413 is removed and an insulating film 416 is formed so as to cover the gate insulating film 405 and the electrodes 406 to 409. For example, a silicon oxynitride (SiOxNy) (x>y) is formed to have a thickness of 100 nm by a plasma CVD method and then a silicon oxide film ($SiO_2$ film) is formed to have a thickness of 200 nm by a thermal CVD method, whereby the insulating layer 416 is formed.

Subsequently, as shown in FIG. 13B, the insulating layer 416 is selectively etched by anisotropic etching on the basis of a perpendicular direction, whereby an insulating layer (hereinafter, referred to as a sidewall insulating layer) 417 which is in contact with sidewalls of the electrodes 406 to 409 is formed. The sidewall insulating layer 417 serves as a mask for doping of an LDD region which is formed later and also is used to prevent the LDD region from being silicified in a silicide step described below. In addition, the gate insulating film is partially removed by this etching, whereby the N-type impurity regions 411 and 412 of the crystalline semiconductor film 403 and the P-type impurity regions 414 and 415 of the crystalline semiconductor film 404 are partially exposed.

Figure 14A:
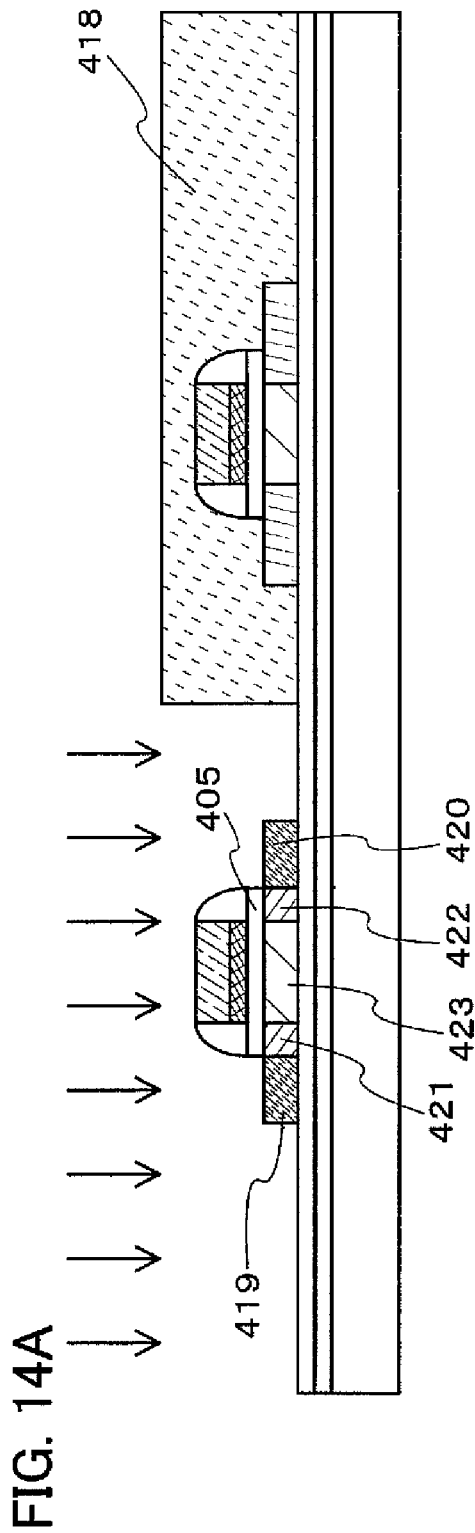
FIGS. 14A and 14B are cross-sectional views each explaining a step performed after steps of FIGS. 13A and 13B.

Next, as shown in FIG. 14A, a mask 418 formed of a resist is formed by a photolithography method. Subsequently, an impurity element (phosphorous) imparting N-type is added to the crystalline semiconductor film 403 by using the sidewall insulating layer 417 as a mask, whereby first N-type impurity regions (referred to as LDD region) 421 and 422 and second N-type impurity regions 419 and 420 are formed. Concentration of an impurity element contained in the first N-type impurity regions 421 and 422 is lower than that of an impurity element contained in the second N-type impurity regions 419 and 420.

Thereafter, the mask 418 is removed. Then, the oxide film formed over the surface of the crystalline silicon film is removed. It is preferable to set etching conditions here to be capable of removing the thin oxide film formed over the surface of the crystalline silicon film and preventing the sidewall insulating layer 417 and the gate insulating film 405 from being etched. Here, a hydrofluoric acid solution in which HF and $H_2O$ are mixed in a ratio of 1 to 99 is dropped on the substrate for 90 seconds while rotating the substrate, and the oxide film is removed. This makes it possible to prevent the sidewall insulating layer 417 and the gate insulating film 405 from being etched when the sidewall layer 417 is a silicon oxynitride (SiOxNy) (x>y) and a silicon oxide film ($SiO_2$ film) and the gate insulating film 405 is silicon oxynitride (SiOxNy) (x>y).

Figure 14B:
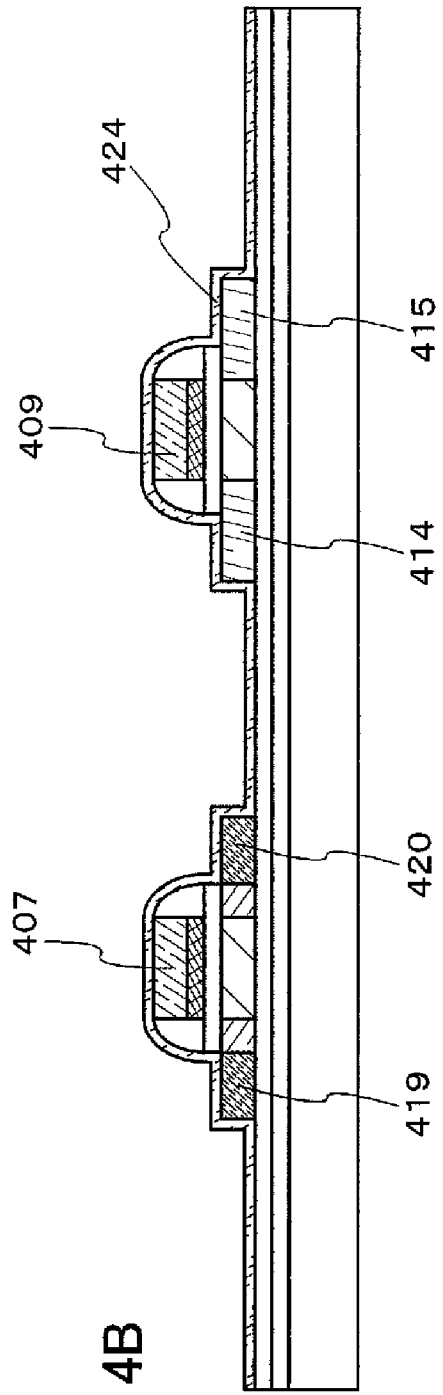

Next, a Ni film 424 is formed over an entire surface by a sputtering method (FIG. 14B).

Then, silicon in each of the second N-type impurity regions 419 and 420 and the P-type impurity regions 414 and 415 is reacted with the Ni film 424 by heat treatment, a GRTA method, an LRTA method, and the like, whereby a Ni silicide layer 425 is formed. It is to be noted that Ni silicide may be formed by laser irradiation or light irradiation by a lamp.

Figure 15A:
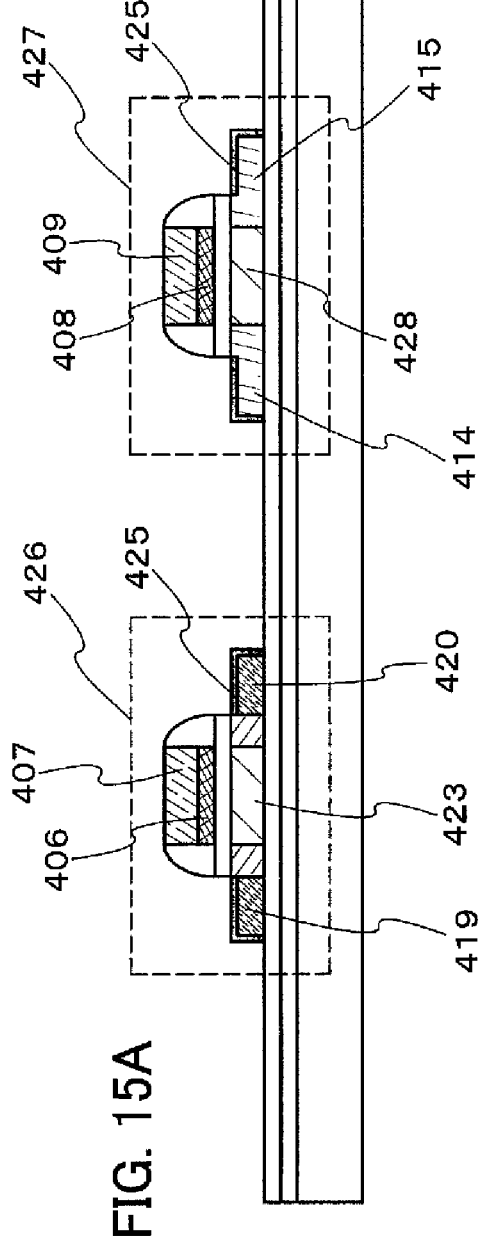
FIGS. 15A and 15B are cross-sectional views each explaining a step performed after steps of FIGS. 14A and 14B.

Next, unreacted Ni is removed (FIG. 15A). Here, unreacted Ni is removed with the use of an etching solution containing HCl, $HNO_3$, and $H_2O$ at a rate of 3:2:1. It is to be noted that, since the etching speed of this etching solution is approximately 100 nm/min as for Ni, and approximately 1 nm/min as for W, the gate electrodes are not damaged. By removing the unreacted Ni, the Ni silicide layer 425 is exposed.

Subsequently, with the use of the method shown in the above Embodiment Mode, it is judged whether silicification is sufficiently processed and the Ni silicide layer 425 is sufficiently formed. For example, when the method shown in FIG. 4 is used, average values of each of R, G, and B are calculated from the image data generated by the imaging device. Then, the average values of each of R, G, and B are substituted into the above Formula 1, whereby saturation $Q_c$ is calculated. Then, the calculated saturation $Q_c$ is substituted into an equation for the correlation between saturation and sheet resistance of a metal silicide layer, whereby sheet resistance value of the metal silicide layer 425 is calculated. When the calculated sheet resistance value is less than or equal to the reference value, it is judged that the metal silicide layer 425 is sufficiently formed and when the calculated sheet resistance is greater than the reference value, it is judged that the metal silicide layer 425 is not sufficiently formed. This method is made possible by adding a saturation and hue calculating portion 30 and a judging portion 40 to a conventional device and nondestructive inspection can be carried out. Therefore, it can be judged efficiently whether the Ni silicide layer 425 is sufficiently formed.

Through the above steps, fundamental structures of an N-type thin film transistor 426 and a P-type thin film transistor 427 are completed. The N-type thin film transistor 426 has a crystalline silicon film including the first N-type impurity regions 421 and 422, the second N-type impurity regions 419 and 420, and a channel formation region 423, the gate insulating layer 405, and the electrodes 406 and 407. Such a structure of the thin film transistor 426 is referred to as an LDD structure.

The P-type thin film transistor 427 has a crystalline silicon film including the P-type impurity regions 414 and 415 and a channel formation region 428, the gate insulating layer 405, and the electrodes 408 and 409. Such a structure of the thin film transistor 427 is referred to as a single drain structure.

It is a feature that a channel length of the thin film transistor 426 and the thin film transistor 427 completed through the above steps is 0.5 to 5 μm, preferably 1 to 3 μm. The above feature enables response speed to be rapid. It is to be noted that the channel length may be set depending on a circuit of the transistor. For example, a channel length of a thin film transistor included in a power supply circuit in which rapid operation is not required may be 3 μm and a channel length of a thin film transistor of other circuits may be 1 μm.

Figure 15B:
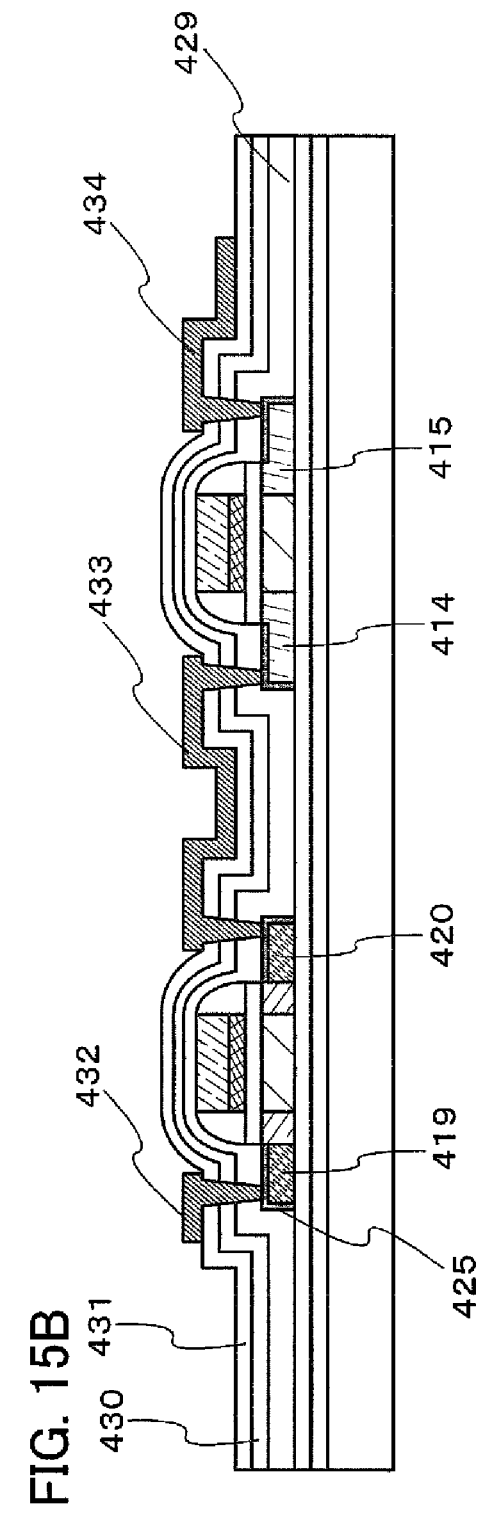

Subsequently, as shown in FIG. 15B, an insulating layer 429 is formed so as to cover the thin film transistors 426 and 427. The insulating layer 429 is formed using silicon oxynitride (SiOxNy) (n>y) with a thickness of 50 nm by a plasma CVD method.

After the insulating layer 429 is formed, heat treatment aimed at hydrogenaration of the silicon film is performed. This heat treatment also restores crystallinity of the silicon film or activates the impurity element added to the silicon film.

Next, a single-layered or stacked-layer insulating layer is formed using an inorganic material such as oxide of silicon and nitride of silicon, an organic material such as polyimide, polyamide, benzocyclobutene, acrylic, epoxy, and siloxane, and the like. A siloxane-based material is, for example, an organic group which has a skeleton structure formed of a bond of silicon and oxygen, and includes at least hydrogen as a substituent. A fluoro group may be used as a substituent. Alternatively, an organic group including at least hydrogen and a fluoro group may be used as a substituent. The shown cross-sectional structure shows a case where the insulating layer covering the thin film transistors 426 and 427 has a three-layered structure. For example, as the structure, a layer containing silicon oxide may be formed as the first insulating layer 429, a layer containing silicon nitride may be formed as a second layer insulating layer 430, and a layer containing silicon oxide may be formed as a third layer insulating layer 431.

Next, the insulating layers 429 to 431 are etched by a photolithography method, whereby contact holes that expose the P-type impurity regions 414 and 415 and the second N-type impurity regions 419 and 420, that is, the Ni silicide layer 425 are formed. Subsequently, a conductive layer is formed so as to fill the contact holes and a pattern process is performed to the conductive layer, whereby conductive layers 432 to 434 serving as a source wiring and a drain wiring are formed.

The conductive layers 432 to 434 are formed of an element selected from titanium (Ti), aluminum (Al), and neodium (Nd) or an alloy material or a compound material containing these elements as its main component to be a single-layer or stacked-layer by a plasma CVD method or a sputtering method. An alloy material containing aluminum as its main component is, for example, a material containing nickel which contains aluminum as its main component or an alloy material containing nickel and one or both of carbon and silicon. A structure in which a barrier layer, an aluminum silicon (Al—Si) layer, and a barrier layer are stacked in this order from the substrate side or a structure in which a barrier layer, an aluminum silicon (Al—Si) layer, a titanium nitride (TiN) layer, and a barrier layer are stacked in this order from the substrate side may be employed for the conductive layers 432 to 434. Further, the barrier layer corresponds to a thin film formed of titanium, nitride of titanium, molybdenum, or nitride of molybdenum. Since aluminum or aluminum silicon has a low resistance value and is inexpensive, aluminum or aluminum silicon is most suitable for the material for forming the conductive layers 432 to 434. When the barrier layer is provided for a top layer and a bottom layer, hillock of aluminum or aluminum silicon can be prevented from being caused. In addition, when a barrier layer is provided for the bottom layer, favorable contact between aluminum or aluminum silicon and a crystalline semiconductor layer can be obtained. Since titanium is an element having a high reducing property, even when a thin natural oxide film is formed on the crystalline semiconductor film, the barrier layer formed of titanium reduces this natural oxide film so that favorable contact with the crystalline silicon film can be obtained. Through the above steps, a TFT is completed.

If a layer formed above the Ni silicide film 425 is transparent, even after the completion of the TFT, silicification can be checked with the use of the evaluation method shown in the above Embodiment Mode. The use of the evaluation method shown in the above Embodiment Mode enables a conventional device to be converted, steps to be shortened, and destructive inspection to be performed; therefore, shortening of steps, early detection of defects, improvement of quality control, and reduction in costs can be achieved in comparison with the conventional evaluation method.

The use of the present invention enables shortening of steps, early detection of defects, improvement of quality control, and reduction in costs; therefore, a TFT capable of rapid operation can be efficiently manufactured. The TFT manufactured using the present invention is suitable for a driver IC, a CPC, an ID chip, and the like.

Embodiment 2

As an electronic appliance to which the present invention is applied, a camera such as a video camera and a digital camera, a goggle type display, a navigation system, a sound reproducing device, a computer, a game machine, a mobile information terminal (such as a mobile computer, a mobile phone, a mobile game machine, or an electronic book), an image reproducing device equipped with a recording medium (a device for reproducing a recording medium such as a digital versatile disk (DVD), which is equipped with a display for displaying the reproduced image), or the like is given. Specific examples of the electronic appliance are shown in FIGS. 16A and 16B and FIGS. 17A to 17E.

Figure 16A:
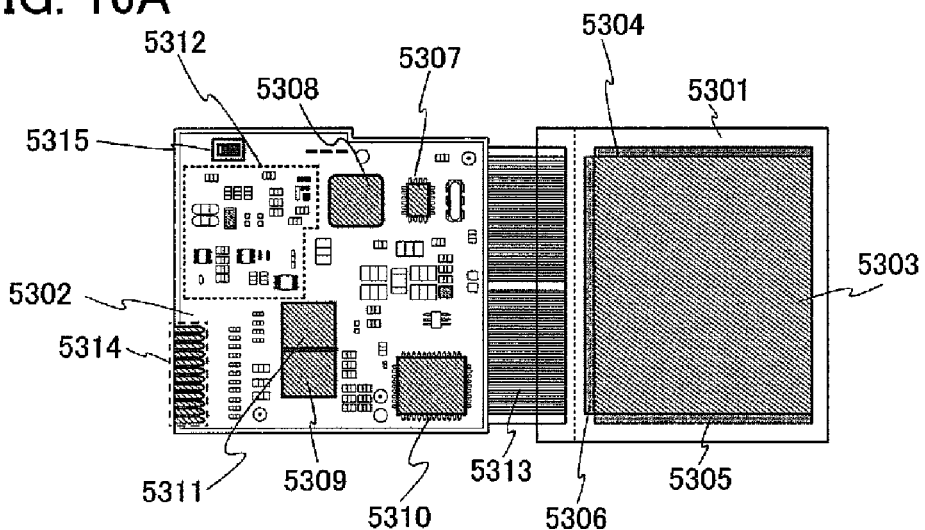
FIGS. 16A and 16B are a plane view for explaining a module according to Embodiment 2 and a circuit diagram of the module shown in FIG. 16A, respectively.

FIG. 16A shows a module in which a display panel 5301 and a printed circuit board 5301 are combined. The printed circuit board 5302 and the display panel 5301 are connected to each other by a flexible wiring board (FPC) 5313.

The display panel 5301 is provided with a pixel portion 5303 in which a plurality of pixels is provided, a first scanning line driver circuit 5304, a second scanning line driver circuit 5305, and a signal line driver circuit 5306 for supplying a video signal to the selected pixel. A TFT is used for each of the pixel portion 5303, the first scanning line driver circuit 5304, the second scanning line driver circuit 5305, and the signal line driver circuit 5306. These TFTs can be manufactured by a method similar to the formation method of the TFT explained in Embodiment 1.

The printed circuit board 5302 is provided with a controller 5307, a central processing unit (CPU) 5308, a memory 5309, a power supply circuit 5310, an audio processing circuit 5311, and a sending and receiving circuit 5312, and the like. A structure may be employed in which a capacitor element and a buffer circuit are provided for the printed circuit board 5302 to prevent noise from causing in a power supply voltage or a signal, or the rising of a signal from dulling. In addition, the controller 5307, the audio processing circuit 5311, the memory 5309, the CPU 5308, the power supply circuit 5310, and the like can be mounted on the display panel 5301 by a COG (Chip On Glass) method. By the COG method, the size of the printed circuit board 5302 can be reduced.

Various control signals are input and output via an interface (I/F) portion 5314 provided on the printed circuit board 5302. An antenna port 5315 for sending and receiving to/from an antenna is provided for the printed circuit board 5302.

Figure 16B:
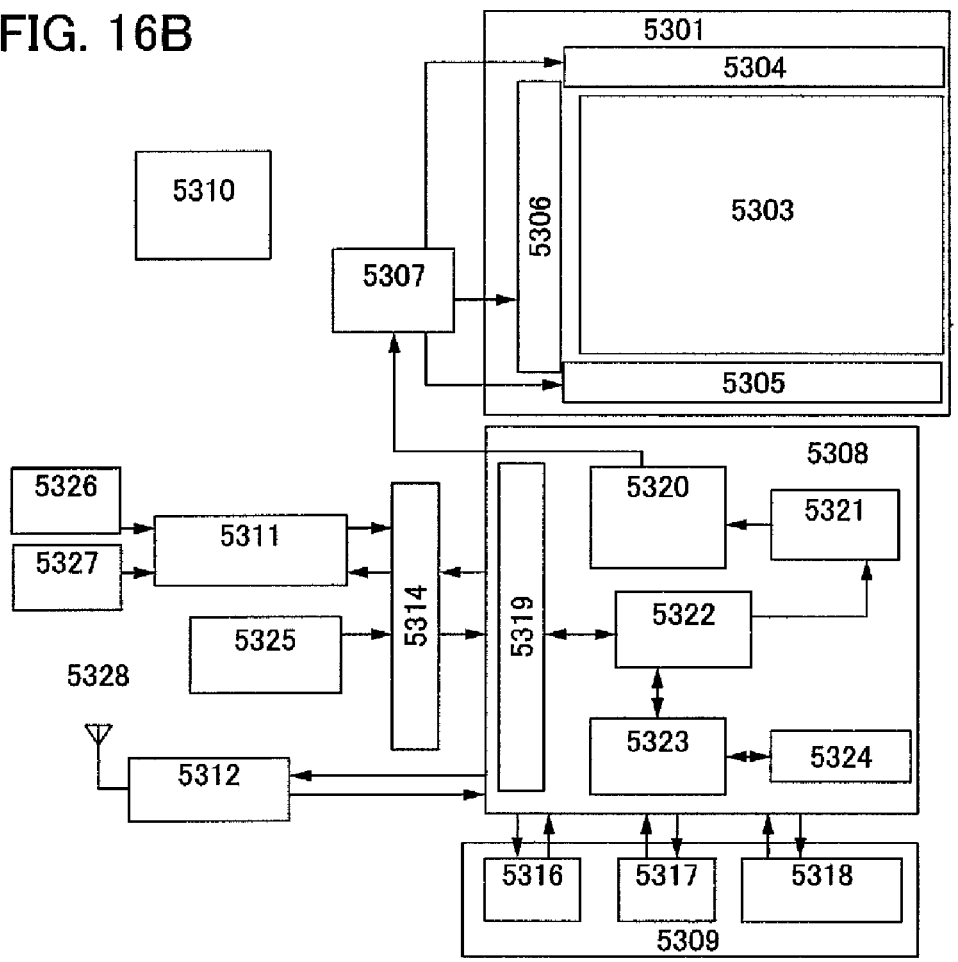

FIG. 16B is a block diagram for showing the module shown in FIG. 16A. This module includes a VRAM 5316, a DRAM 5317, a flash memory 5318, and the like as a memory 5309. The VRAM 5316 stores data of an image displayed on a panel, the DRAM 5317 stores video data or audio data, and the flash memory stores various programs.

The power supply circuit 5310 supplies electricity for operating the display panel 5301, the controller 5307, the CPU 5308, the audio processing circuit 5311, the memory 5309, and the sending and receiving circuit 5312. The power supply circuit 5310 may be provided with a current source, depending on a panel specification.

The CPU 5308 includes a control signal generation circuit 5320, a decoder 5321, a resistor 5322, an arithmetic circuit 5323, a RAM 5324, an interface 5319 for the CPU 5308, and the like. Various signals input to the CPU 5308 via the interface 5319 are once stored in the resister 5322, then input to the arithmetic circuit 5323, the decoder 5321, or the like. The arithmetic circuit 5323 carries out an operation on the basis of the input signal to designate the location to which various instructions are sent. On the other hand, the signal input to the decoder 5321 is decoded and input to the control signal generation circuit 5320. The control signal generation circuit 5320 produces a signal including various instructions on the basis of the input signal, and sends the signal to the location designated by the arithmetic circuit 5323, specifically, the memory 5309, the sending and receiving circuit 5312, the audio processing circuit 5311, the controller 5307, and the like.

The memory 5309, the sending and receiving circuit 5312, the audio processing circuit 5311, and the controller 5307 operate in accordance with the instruction received by each of them. Hereinafter, the operations of the controller 5307, the sending and receiving circuit 5312, and the audio processing circuit 5311 will be briefly explained.

The signal input from input means 5325 is sent to the CPU 5308 mounted on the printed circuit board 5302 via the I/F portion 5314. The control signal generation circuit 5320 converts image data stored in the VRAM 5316 into a predetermined format to send the converted data to the controller 5307, in accordance with the signal sent from the input means 5325 such as a pointing device or a keyboard.

The controller 5307 carries out data processing for the signal including the video data sent from the CPU 5308 in accordance with the panel specification, and supplies the signal to the display panel 5301. Furthermore, the controller 5307 produces a Hsync signal, a Vsync signal, a clock signal CLK, an alternating voltage (AC Cont), and a shift signal L/R on the basis of a power supply voltage input from the power supply circuit 5310 or various signals input from the CPU 5308, and supplies the signals to the display panel 5301.

The sending and receiving circuit 5312 processes a signal sent and received by the antenna 5328 as an electric wave. Among the signals sent and received by the sending and receiving circuit 5312, the signal including audio information is sent to the audio processing circuit 5311 in accordance with an instruction from the CPU 5308.

The signal including audio information which is sent in accordance with the instruction by the CPU 5308 is demodulated into an audio signal in the audio processing circuit 5311 and is sent to a speaker 5327. An audio signal sent from a microphone 5326 is modulated in the audio processing circuit 5311 and is sent to the sending and receiving circuit 5312 in accordance with an instruction by the CPU 5308.

The TFT manufactured using the method shown in Embodiment 1 can be used for the CPU 5308, the controller 5307, the memory 5309, and the like of the module shown in FIG. 16A. The TFT manufactured using the present invention is capable of rapid operation; therefore, the TFT is suitable for the CPU 5308 and the like.

Figure 17A:
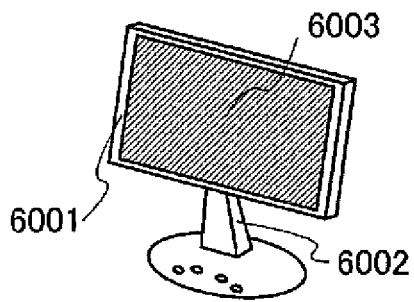
FIGS. 17A to 17E are perspective views each explaining an electronic appliance according to Embodiment 2.

FIG. 17A shows a liquid crystal display or an OLED display, which includes a housing 6001, a supporting base 6002, a display portion 6003, and the like. The TFT manufactured using the present invention has low sheet resistance and is capable of rapid operation; therefore, the TFT can be used for a CPU for processing image data or the like displayed on the liquid crystal display or the OLED display. In addition, the structure of a liquid crystal module or an EL module, and the module shown in FIG. 16A can be applied to the display portion 6003.

By applying the TFT manufactured using the method shown in Embodiment 1 to the liquid crystal display or the OLED display, a display capable of rapid operation can be manufactured. Also, the use of the evaluation method shown in Embodiment Mode enables a conventional device to be converted, analysis time to be shortened, and destructive inspection to be performed; therefore, shortening of steps, early detection of defects, improvement of quality control, and reduction in costs can be achieved in comparison with the conventional evaluation method.

Figure 17B:
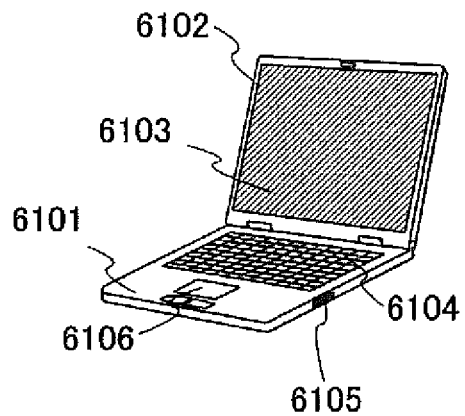

FIG. 17B shows a computer, which includes a main body 6101, a housing 6102, a display portion 6103, a keyboard 6104, an external connection port 6105, a pointing mouse 6106, and the like. The TFT manufactured using the method shown in Embodiment 1 has low sheet resistance and is capable of rapid operation; therefore, the TFT can be used for a CPU for processing image data or the like displayed on the computer. Also, the TFT can be applied to the display portion 6103 with the use of the structure of a liquid crystal module or an EL module, and the module shown in FIG. 16A.

By applying the TFT manufactured using the method shown in Embodiment 1 to the computer, a computer capable of rapid operation can be manufactured. Also, the use of the evaluation method shown in Embodiment Mode enables a conventional device to be converted, analysis time to be shortened, and destructive inspection to be performed; therefore, shortening of steps, early detection of defects, improvement of quality control, and reduction in costs can be achieved in comparison with the conventional evaluation method.

Figure 17C:
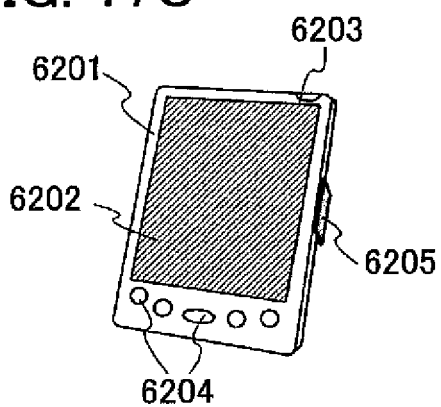

FIG. 17C shows a portable computer, which includes a main body 6201, a display portion 6202, a switch 6203, operation keys 6204, an infrared port 6205, and the like. The TFT manufactured using the method shown in Embodiment 1 has low sheet resistance and is capable of rapid operation; therefore, the TFT can be used for a CPU for processing image data or the like displayed on the computer. Also, the TFT can be applied to the display portion 6202 with the use of the structure of a liquid crystal module or an EL module, and the module shown in FIG. 16A.

By applying the TFT manufactured using the method shown in Embodiment 1 to the computer, a display capable of rapid operation can be manufactured. Also, the use of the evaluation method shown in Embodiment Mode enables a conventional device to be converted, analysis time to be shortened, and destructive inspection to be performed; therefore, shortening of steps, early detection of defects, improvement of quality control, and reduction in costs can be achieved in comparison with the conventional evaluation method.

Figure 17D:
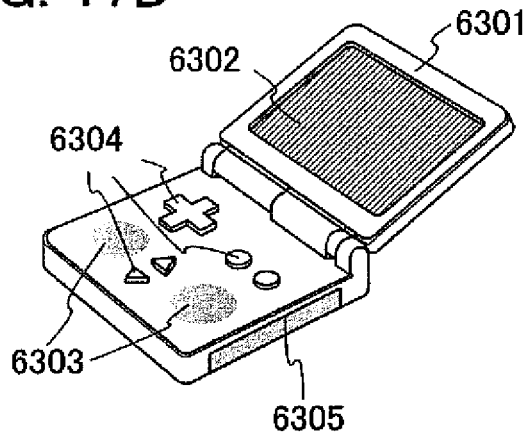

FIG. 17D shows a portable game machine, which includes a housing 6301, a display portion 6302, a speaker portion 6303, operation keys 6304, a recording medium insert portion 6305, and the like. The TFT manufactured using the method shown in Embodiment 1 has low sheet resistance and is capable of rapid operation; therefore, the TFT can be used for a CPU for processing image data or the like displayed on the game machine. Also, the TFT can be applied to the display portion 6302 with the use of the structure of a liquid crystal module or an EL module, and the module shown in FIG. 16A.

By applying the TFT manufactured using the method shown in Embodiment 1 to the game machine, a display capable of rapid operation can be manufactured. Also, the use of the evaluation method shown in Embodiment Mode enables a conventional device to be converted, analysis time to be shortened, and destructive inspection to be performed; therefore, shortening of steps, early detection of defects, improvement of quality control, and reduction in costs can be achieved in comparison with the conventional evaluation method.

Figure 17E:
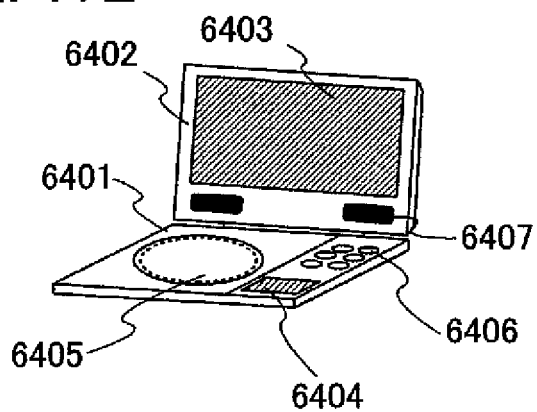

FIG. 17E shows a portable image reproducing device equipped with a recording medium (specifically, a DVD reproducing device), which includes a main body 6401, a housing 6402, a display portion A 6403, a display portion B 6404, a recording medium (DVD or the like) reading portion 6405, operation keys 6406, a speaker portion 6407, and the like. The display portion A 6403 mainly displays image information and the display portion B 6404 mainly displays a character information. The TFT manufactured using the method shown in Embodiment 1 has low sheet resistance and is capable of rapid operation; therefore, the TFT can be used for a CPU for processing image data or the like displayed on the image reproducing device. Also, the TFT can be applied to the display portion A 6403 and the display portion B 6404 with the use of the structure of a liquid crystal module or an EL module, and the module shown in FIG. 16A. It is to be noted that the image reproducing device equipped with a recording medium includes a home game machine or the like.

By applying the TFT manufactured using the method shown in Embodiment 1 to the image reproducing device, a display capable of rapid operation can be manufactured. Also, the use of the evaluation method shown in Embodiment Mode enables a conventional device to be converted, analysis time to be shortened, and destructive inspection to be performed; therefore, shortening of steps, early detection of defects, improvement of quality control, and reduction in costs can be achieved in comparison with the conventional evaluation method.

Not only a glass substrate but also a heat-resistant plastic substrate can be used for a display device used for these electronic appliances, depending on a size, strength, or an intended purpose. Accordingly, further reduction in weight can be achieved.

It is to be noted that the examples shown in this embodiment are only one example and the present invention is not limited to these applications.

This embodiment can be implemented by freely being combined with any descriptions of the above Embodiment Mode and Embodiments.

In addition, the present invention is not limited to the above Embodiment Mode and can be implemented by being variously modified without departing from the spirit of the present invention.

This application is based on Japanese Patent Application serial no. 2005-378220 filed in Japan Patent Office on Dec. 28, in 2005, the entire contents of which are hereby incorporated by reference.

What is claimed is:

1. A semiconductor inspection device comprising:
    imaging means for generating image data by performing color imaging of a metal silicide layer formed over a surface of a semiconductor layer containing silicon;
    a saturation calculating portion for calculating saturation of the metal silicide layer by processing the image data; and
    a judging portion for judging a formation amount of the metal silicide layer on the basis of the saturation calculated by the saturation calculating program.

2. The semiconductor inspection device according to claim 1, wherein the judging portion has an equation expressing the correlation between sheet resistance and saturation of the metal silicide layer and judges that the metal silicide layer is sufficiently formed when the saturation calculating program calculates sheet resistance by substituting calculated saturation into the equation and the calculated sheet resistance is less than or equal to a reference value.

3. The semiconductor inspection device according to claim 1, wherein the judging portion has an equation expressing the correlation between thickness and saturation of the metal silicide layer and judges that the metal silicide layer is sufficiently formed when the saturation calculating program calculates thickness by substituting calculated saturation into the equation and the calculated thickness is greater than or equal to a reference value.

4. The semiconductor inspection device according to claim 1, wherein the image data is RGB image data and the saturation calculating program calculates saturation of the metal silicide layer by processing the RGB image data when an average value of G is greater than an average value of B in the RGB image data.

5. The semiconductor inspection device according to claim 1, wherein the judging portion is a program which is installed on a computer system through a recording medium.

6. The semiconductor inspection device according to claim 1, wherein the saturation calculating portion is a program which is installed on a computer system through a recording medium.

7. A semiconductor inspection device comprising:
    imaging means for generating image data by performing color imaging of a metal silicide layer formed over a surface of a semiconductor layer containing silicon;
    a hue calculating portion for calculating hue of the metal silicide layer by processing the image data; and
    a judging portion for judging a formation amount of the metal silicide layer on the basis of the hue calculated by the hue calculating program.

8. The semiconductor inspection device according to claim 7, wherein the judging portion has an equation expressing the correlation between sheet resistance and hue of the metal silicide layer and judges that the metal silicide layer is sufficiently formed when the hue calculating program calculates sheet resistance by substituting calculated hue into the equation and the calculated sheet resistance is less than or equal to a reference value.

9. The semiconductor inspection device according to claim 7, wherein the judging portion has an equation expressing the correlation between thickness and hue of the metal silicide layer and judges that the metal silicide layer is sufficiently formed when the hue calculating program calculates thickness by substituting calculated hue for the equation and the calculated thickness is greater than or equal to a reference value.

10. The semiconductor inspection device according to claim 7, wherein the image data is RGB image data and the hue calculating program calculates hue of the metal silicide layer by processing the RGB image data when an average value of G is greater than an average value of B in the RGB image data.

11. The semiconductor inspection device according to claim 7, wherein the judging portion is a program which is installed on a computer system through a recording medium.

12. The semiconductor inspection device according to claim 7, wherein the hue calculating portion is a program which is installed on a computer system through a recording medium.

13. A semiconductor inspection device comprising:
    imaging means for generating image data by performing color imaging of a metal silicide layer containing silicon;
    a saturation calculating portion for calculating saturation of the metal silicide layer by processing the image data; and
    a judging portion for judging a formation amount of the metal silicide layer on the basis of the saturation calculated by the saturation calculating program,
    wherein the imaging means is above the metal silicide layer.

14. The semiconductor inspection device according to claim 13, wherein the judging portion has an equation expressing the correlation between sheet resistance and saturation of the metal silicide layer and judges that the metal silicide layer is sufficiently formed when the saturation calculating program calculates sheet resistance by substituting calculated saturation into the equation and the calculated sheet resistance is less than or equal to a reference value.

15. The semiconductor inspection device according to claim 13, wherein the judging portion has an equation expressing the correlation between thickness and saturation of the metal silicide layer and judges that the metal silicide layer is sufficiently formed when the saturation calculating program calculates thickness by substituting calculated saturation into the equation and the calculated thickness is greater than or equal to a reference value.

16. The semiconductor inspection device according to claim 13, wherein the image data is RGB image data and the saturation calculating program calculates saturation of the metal silicide layer by processing the RGB image data when an average value of G is greater than an average value of B in the RGB image data.

17. The semiconductor inspection device according to claim 13, wherein the judging portion is a program which is installed on a computer system through a recording medium.

18. The semiconductor inspection device according to claim 13, wherein the saturation calculating portion is a program which is installed on a computer system through a recording medium.

19. A semiconductor inspection device comprising:
  imaging means for generating image data by performing color imaging of a metal silicide layer containing silicon;
  a hue calculating portion for calculating hue of the metal silicide layer by processing the image data; and
  a judging portion for judging a formation amount of the metal silicide layer on the basis of the hue calculated by the hue calculating program wherein the imaging means is above the metal silicide layer.

20. The semiconductor inspection device according to claim 19, wherein the judging portion has an equation expressing the correlation between sheet resistance and hue of the metal silicide layer and judges that the metal silicide layer is sufficiently formed when the hue calculating program calculates sheet resistance by substituting calculated hue into the equation and the calculated sheet resistance is less than or equal to a reference value.

21. The semiconductor inspection device according to claim 19, wherein the judging portion has an equation expressing the correlation between thickness and hue of the metal silicide layer and judges that the metal silicide layer is sufficiently formed when the hue calculating program calculates thickness by substituting calculated hue for the equation and the calculated thickness is greater than or equal to a reference value.

22. The semiconductor inspection device according to claim 19, wherein the image data is RGB image data and the hue calculating program calculates hue of the metal silicide layer by processing the RGB image data when an average value of G is greater than an average value of B in the RGB image data.

23. The semiconductor inspection device according to claim 19, wherein the judging portion is a program which is installed on a computer system through a recording medium.

24. The semiconductor inspection device according to claim 19, wherein the hue calculating portion is a program which is installed on a computer system through a recording medium.

* * * * *